US012641828B2

(12) United States Patent
Bao et al.

(10) Patent No.: US 12,641,828 B2
(45) Date of Patent: May 26, 2026

(54) STACKED FET STRUCTURES WITH DIFFERENT GATE DIELECTRIC COMPOSITIONS OR THICKNESSES

(71) Applicant: International Business Machines Corporation, Armonk, NY (US)

(72) Inventors: Ruqiang Bao, Niskayuna, NY (US);
Dechao Guo, Niskayuna, NY (US);
Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 664 days.

(21) Appl. No.: 18/073,671

(22) Filed: Dec. 2, 2022

(65) Prior Publication Data

US 2024/0186394 A1 Jun. 6, 2024

(51) Int. Cl.
H10D 30/67 (2025.01)
H10D 30/01 (2025.01)
(Continued)

(52) U.S. Cl.
CPC ....... H10D 30/6735 (2025.01); H10D 30/014 (2025.01); H10D 30/43 (2025.01); H10D 30/6757 (2025.01); H10W 90/00 (2026.01)

(58) Field of Classification Search
CPC .. H10D 30/6735; H10D 30/014; H10D 30/43; H10D 30/6757; H10D 64/017;
(Continued)

(56) References Cited

U.S. PATENT DOCUMENTS

| 10,420,171 | B2 | 9/2019 | Goktepeli |
| 11,211,245 | B2 | 12/2021 | Ahmed et al. |
(Continued)

FOREIGN PATENT DOCUMENTS

CN 106098689 B 7/2019

OTHER PUBLICATIONS

Wen, Zhenping, et al. "Ultrathin interfacial SiO2 layer process research for high-k gate last gate stacks." 2015 China Semiconductor Technology International Conference. IEEE, 2015. (Year: 2015).*
(Continued)

*Primary Examiner* — Lex H Malsawma
*Assistant Examiner* — Ethan Edward Cutler
(74) *Attorney, Agent, or Firm* — Seed Intellectual Property Law Group LLP

(57) ABSTRACT

Bonded stacked FETs with individually tunable gate dielectrics are provided. In one aspect, a stacked FET device includes: a bottom transistor disposed on a wafer; and a top transistor bonded on top of the bottom transistor via a bonding layer, where the bottom transistor includes a stack of first active layers, a first gate dielectric disposed on the first active layers, and a first gate electrode disposed on the first gate dielectric, where the top transistor includes a stack of second active layers, a second gate dielectric disposed on the second active layers, and a second gate electrode disposed on the second gate dielectric, and where the first gate dielectric has at least one of a different composition and a different thickness from the second gate dielectric. A method of forming the present stacked FET devices is also provided.

20 Claims, 20 Drawing Sheets

X Cut

(51) Int. Cl.
H10D 30/43 (2025.01)
H10W 90/00 (2026.01)

(58) Field of Classification Search
CPC .. H10D 62/121; H10D 64/667; H10D 84/038;
H10D 84/83; H10D 88/00; H10D 88/01;
H01L 25/074
See application file for complete search history.

(56) References Cited

U.S. PATENT DOCUMENTS

| | | | |
|---|---|---|---|
| 2015/0333056 A1* | 11/2015 | Du | H01L 21/76895 |
| | | | 257/773 |
| 2020/0105751 A1* | 4/2020 | Dewey | H10D 62/235 |
| 2020/0212038 A1* | 7/2020 | Rachmady | H10D 84/0167 |
| 2020/0294998 A1 | 9/2020 | Lilak et al. | |
| 2021/0091080 A1 | 3/2021 | Dewey et al. | |
| 2022/0310456 A1* | 9/2022 | Hall | H10D 30/6735 |
| 2022/0384434 A1* | 12/2022 | Huang | H01L 21/28185 |

OTHER PUBLICATIONS

Koyanagi et al., "Three-Dimensional Integration Technology Based on Wafer Bonding With Vertical Buried Interconnections," IEEE Transactions on Electron Devices, vol. 53, No. 11, pp. 2799-2808 (Nov. 2006).

* cited by examiner

X Cut

Y Cut

X Cut

Y Cut

X Cut

Y Cut

X Cut

Y Cut

X Cut

Y Cut

X Cut

Y Cut

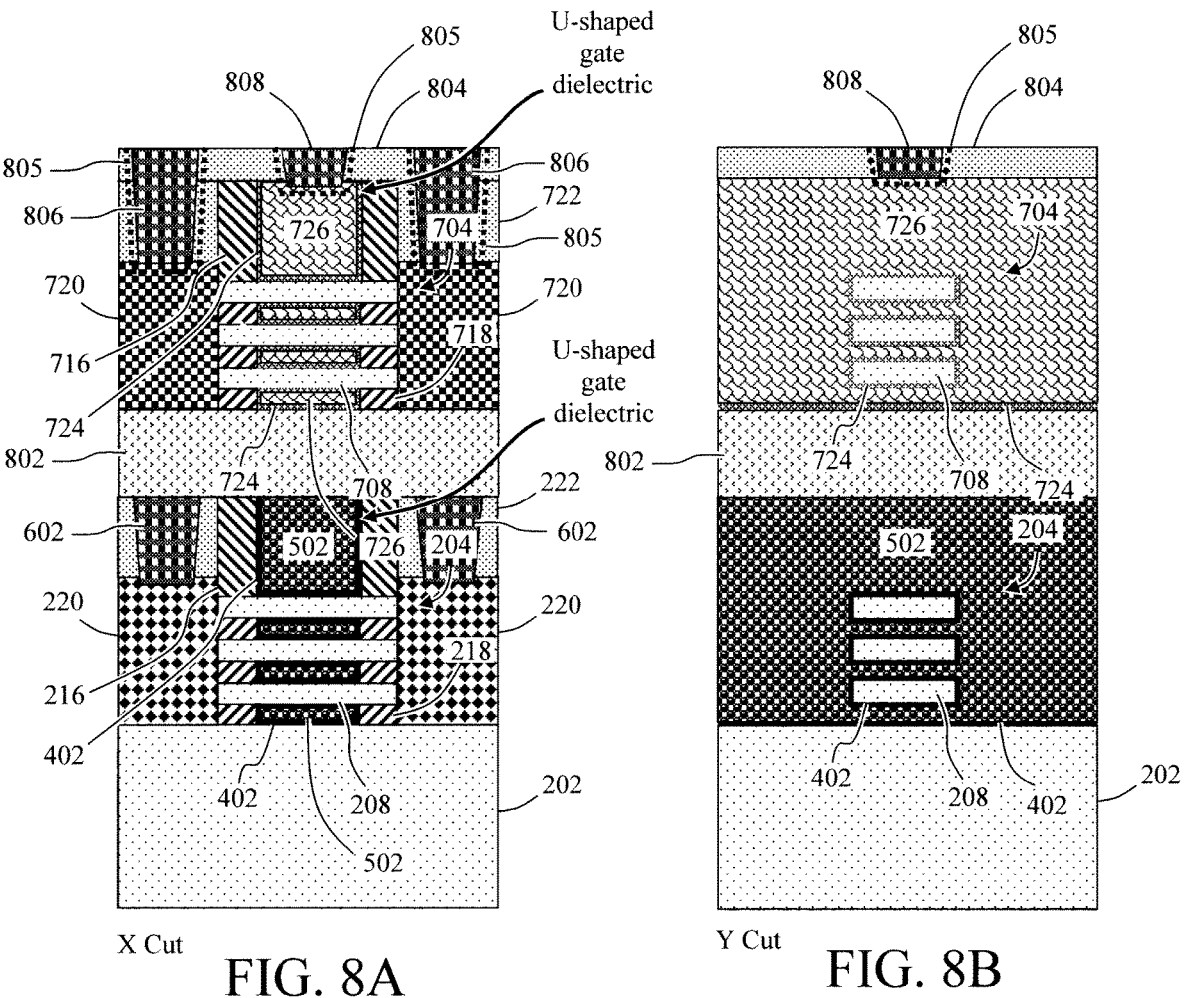
FIG. 8A
FIG. 8B
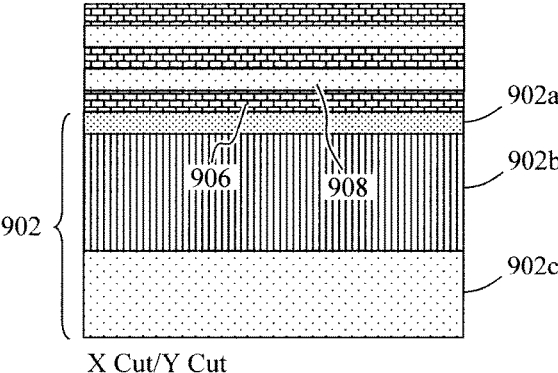
FIG. 9

1002a

1002b

1002

1002c

X Cut/Y Cut 1006    1008

1002a

1102

1006    1008

902a

902b

902

902c 906    908

X Cut/Y Cut

X Cut

Y Cut

X Cut

Y Cut

X Cut

Y Cut

STACKED FET STRUCTURES WITH DIFFERENT GATE DIELECTRIC COMPOSITIONS OR THICKNESSES

FIELD OF THE INVENTION

The present invention relates to stacked field-effect transistors (FETs), and more particularly, to bonded stacked FETs with individually tunable gate dielectrics, and techniques for fabrication thereof.

BACKGROUND OF THE INVENTION

The gate dielectric requirements for p-channel field-effect transistors (pFETs) and n-channel field-effect transistors (nFETs) are different due to different switching mechanisms. Thus, ideally the gate dielectric materials and their respective properties such as thickness would be individually tailored depending on whether they are being employed for a pFET or an nFET transistor. However, due to integration challenges in horizontal complementary metal oxide semiconductor (CMOS) architectures, the standard practice is to use the same gate dielectric such as hafnium oxide ($HfO_2$) in both pFET and nFET transistors. While a common gate dielectric material can be somewhat optimized to balance the electrical data between the pFET and nFET transistors, it still does not produce the best electrical data for each pFET and nFET transistor individually.

A stacked field-effect transistor (stacked FET) is a new device architecture for future logic technology. With a stacked FET, a pFET transistor is stacked vertically on top of an nFET, or vice versa. Thus, with this new integration design pFET and nFET transistors can be implemented without expanding the overall device footprint. Employing a stacked FET design, however, presents some notable challenges such as optimizing the gate dielectric for each of the transistors in the stack.

SUMMARY OF THE INVENTION

The present invention provides bonded stacked field-effect transistors (FETs) with individually tunable gate dielectrics. In one aspect of the invention, a stacked FET device is provided. The stacked FET device includes: a bottom transistor disposed on a wafer; and a top transistor bonded on top of the bottom transistor via a bonding layer, where the bottom transistor includes a stack of first active layers, a first gate dielectric disposed on the first active layers, and a first gate electrode disposed on the first gate dielectric, where the top transistor includes a stack of second active layers, a second gate dielectric disposed on the second active layers, and a second gate electrode disposed on the second gate dielectric, and where the first gate dielectric has at least one of a different composition and a different thickness from the second gate dielectric.

Advantageously, varying the composition and/or thickness of the first and second gate dielectrics enables individual tuning of the threshold voltage of the top transistor relative to the bottom transistor, and vice versa. Notably, the present techniques result in a unique orientation of components. For instance, the first gate dielectric of the bottom transistor can be present over the stack of first active layers along a bottom and opposite sidewalls of the first gate electrode, while the second gate dielectric of the top transistor can be present over the stack of second active layers along a bottom and opposite sidewalls of the second gate electrode. This configuration is achieved by bonding two nearly-complete bottom and top transistors together. Alternatively, wafer bonding can be performed earlier in the process. In that case, the resulting stacked FET structure will have the first gate dielectric of the bottom transistor present below the stack of first active layers along a top and opposite sidewalls of the first gate electrode, whereas the second gate dielectric of the top transistor is present over the stack of second active layers along a bottom and opposite sidewalls of the second gate electrode.

In another aspect of the invention, another stacked FET device is provided. The stacked FET device includes: a bottom transistor disposed on a wafer; and a top transistor bonded on top of the bottom transistor via a bonding layer, where the bottom transistor includes a stack of first active layers, a first interfacial layer disposed on the first active layers, a first gate dielectric disposed on first interfacial layer, and a first gate electrode disposed on the first gate dielectric, where the top transistor includes a stack of second active layers, a second interfacial layer disposed on the second active layers, a second gate dielectric disposed on the second interfacial layer, and a second gate electrode disposed on the second gate dielectric, and where the first gate dielectric has at least one of a different composition and a different thickness from the second gate dielectric. Optionally, the first interfacial layer can have at least one of a different composition and a different thickness from the second interfacial layer.

In yet another aspect of the invention, a method is provided that includes: forming a stacked FET device on a wafer, the stacked FET device having a bottom transistor disposed on the wafer, and a top transistor bonded on top of the bottom transistor via a bonding layer, where the bottom transistor includes a stack of first active layers, a first gate dielectric disposed on the first active layers, and a first gate electrode disposed on the first gate dielectric, where the top transistor includes a stack of second active layers, a second gate dielectric disposed on the second active layers, and a second gate electrode disposed on the second gate dielectric, and where the first gate dielectric has at least one of a different composition and a different thickness from the second gate dielectric. As highlighted above, the wafer bonding can involve two nearly-complete bottom and top transistors. For instance, the bottom transistor having the first gate dielectric can be formed, the top transistor having the second gate dielectric can be formed, and the top transistor can be bonded to a top of the bottom transistor via the bonding layer.

Alternatively, the bonding can be performed earlier in the process. For instance, a first stack of active layers can be bonded to a second stack of active layers via the bonding layer to form a stacked structure. The bottom transistor having the first gate dielectric can be formed in the second stack of active layers. The stacked structure is flipped, and the top transistor having the second gate dielectric can be formed in the first stack of active layers.

A more complete understanding of the present invention, as well as further features and advantages of the present invention, will be obtained by reference to the following detailed description and drawings.

BRIEF DESCRIPTION OF THE DRAWINGS

FIG. 8A is an X cross-sectional view and FIG. 8B is a Y cross-sectional view illustrating the wafer having been removed from the second/top transistor, the second/top transistor having been bonded to the first/bottom transistor via a bonding layer, and interconnects having been formed to the second source/drain regions and the second gate electrode according to an embodiment of the present invention;

FIG. 9 is both an X and a Y cross-sectional view illustrating, according to an alternative embodiment, a (first) stack of alternating (first) sacrificial layers and (first) active layers having been formed on a (first) wafer according to an embodiment of the present invention;

DETAILED DESCRIPTION OF PREFERRED EMBODIMENTS

Provided herein are stacked field-effect transistors (FETs) formed using wafer bonding techniques which advantageously enable individual tuning of the gate dielectrics of the top and bottom transistors. In general, a stacked FET architecture includes a (first) bottom transistor of a first polarity and a (second) top transistor of a second polarity stacked vertically on top of the first/bottom transistor. For instance, by way of example only, the first transistor of the first polarity can be a p-channel field-effect transistor (pFET) and the second transistor of the second polarity can be an n-channel field-effect transistor (nFET), or vice versa. As will be described in detail below, by employing a bonded stacked transistor scheme, the composition, thickness, etc. of the gate dielectric can be optimized for its corresponding transistor (e.g., pFET or nFET) irrespective of the device of the opposite polarity (e.g., nFET or pFET) with which it is stacked.

An exemplary methodology for fabricating a stacked FET device in accordance with the present techniques having individually tunable gate dielectrics for the first/bottom and second/top transistors is now described by way of reference to FIGS. 1-8. In the present example, the bottom and top transistors will be fabricated separately. Wafer bonding techniques will then be employed to stack the top transistor on the bottom transistor, followed by wiring. In an alternative embodiment presented below, the bottom and top transistors are built on a bonded substrate that, after formation of the bottom transistor, is inverted to enable formation of the top transistor, followed by wiring.

Figure 1:
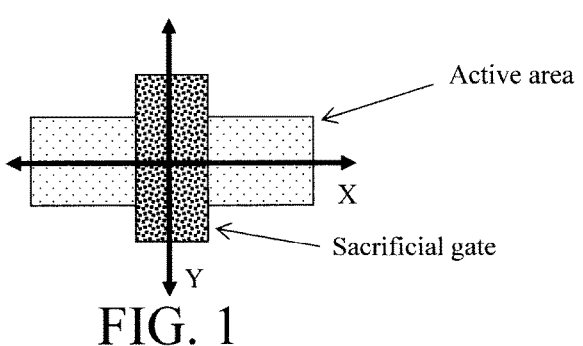
FIG. 1 is a top-down diagram illustrating the overall layout of the present stacked field-effect transistor (FET) device and the orientations of the X and Y cross-sectional views shown in the figures according to an embodiment of the present invention.

FIG. 1 is a top-down diagram illustrating an overall layout of the present stacked FET device design. As shown in FIG. 1, the present techniques employ a device architecture having at least one active area containing stacked transistors, a first/bottom transistor of a first polarity and a second/top transistor of a second polarity (e.g., a pFET and an nFET, or vice versa), stacked one on top of another.

As will be described in detail below, sacrificial gates will be employed in each of the bottom and top transistors. For instance, one sacrificial gate will be used during the formation of the bottom transistor, and another sacrificial gate will be used during the formation of the top transistor. As shown in FIG. 1, those sacrificial gates will be oriented orthogonal to the active area. Notably, since the bottom/top transistors are stacked vertically, only one of those sacrificial gates will be visible from a top-down view at any given time. However, the orientation of sacrificial gates, whether bottom or top, are the same as that shown in FIG. 1.

The term 'sacrificial,' as used herein, refers to a material or structure that is used in one part of the process, and then later removed, in whole or in part, during fabrication of the stacked FET device. Thus, as is apparent from FIG. 1, a gate-last approach will be employed in the present examples. With a gate-last approach, sacrificial gates are used as a placeholder during formation of the source/drain regions of the respective bottom and top transistors. The sacrificial gates are removed later on in the process, and replaced with the final gates of the device (also referred to herein as 'replacement gates'). When the replacement gates are metal gates, they may also be referred to herein as 'replacement metal gates.' Advantageously, the use of a gate-last process avoids exposing the replacement gate materials such as high-k dielectrics to potentially damaging conditions such as the high temperatures experienced during source/drain region formation. Thus, the orientation of the replacement metal gates vis-à-vis the active area will be the same as that of the sacrificial gate shown.

FIG. 1 further illustrates the orientations of the cross-sectional views that will be shown in the following figures. For instance, as shown in FIG. 1, the X cross-sectional views that will be shown in the following figures depict cuts through the active area perpendicular to the sacrificial gate. The Y cross-sectional views depict cuts perpendicular to the active area through the sacrificial gate.

Figure 2A:
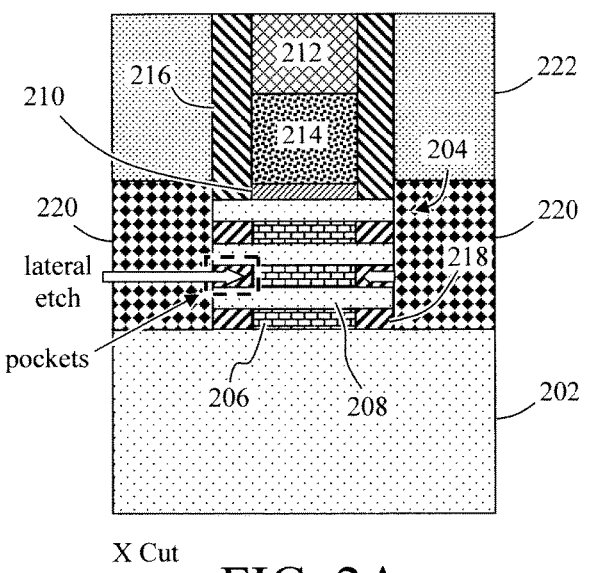
FIG. 2A is an X cross-sectional view and FIG. 2B is a Y cross-sectional view illustrating a (first) device stack having been formed on a wafer (the first device stack having been formed on a wafer (the first device stack having alternating (first) sacrificial and active layers), a (first) sacrificial gate oxide having been formed on the first device stack, a (first) sacrificial gate having been formed on the first device stack (over the first sacrificial gate oxide) using a (first) sacrificial gate hardmask. (first) dielectric spacers having been formed alongside the first sacrificial gate hardmask and first sacrificial gate, (first) inner spacers having been formed alongside the first sacrificial layers, (first) source/drain regions having been formed on opposite sides of the first sacrificial gate alongside the first sacrificial layers and active layers, and an interlayer dielectric having been deposited onto the device structure according to an embodiment of the present invention.
Figure 2B:
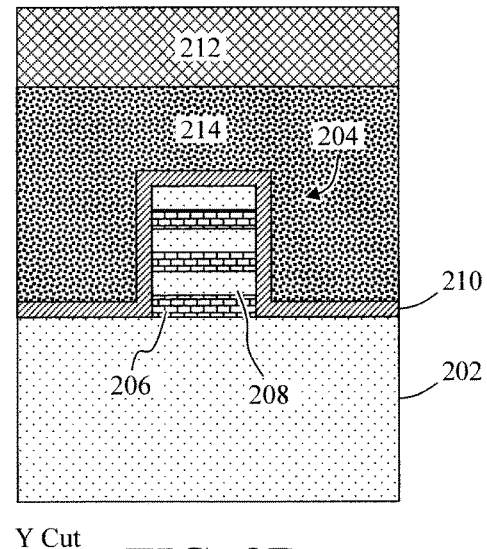
Figure 3A:
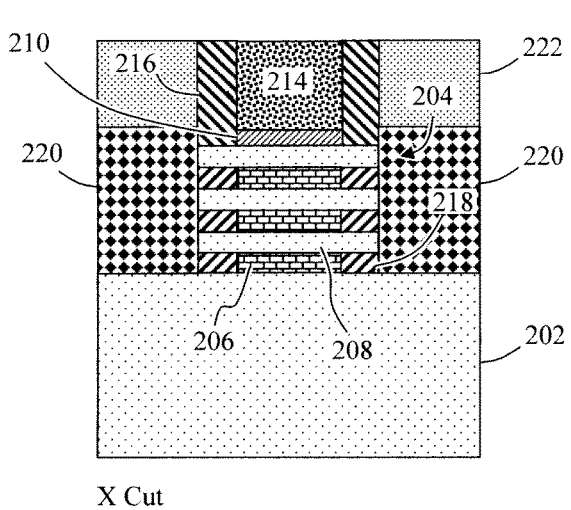
FIG. 3A is an X cross-sectional view and FIG. 3B is a Y cross-sectional view illustrating the interlayer dielectric having been polished which removes the first sacrificial gate hardmask thereby exposing the underlying first sacrificial gate according to an embodiment of the present invention.
Figure 3B:
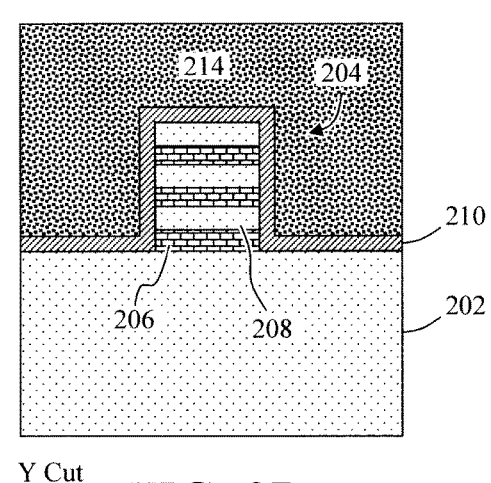

As shown in FIG. 2A (an X cross-sectional view) and FIG. 2B (a Y cross-sectional view), the process begins with the formation of a (first) device stack 204 on a wafer 202 (the device stack 204 having alternating (first) sacrificial layers 206 and active layers 208), a (first) sacrificial gate oxide 210 is formed on the device stack 204, a (first) sacrificial gate 214 is formed on the device stack 204 (over the sacrificial gate oxide 210) using a (first) sacrificial gate hardmask 212, (first) dielectric spacers 216 are formed alongside the sacrificial gate hardmask 212 and sacrificial gate 214, (first) inner spacers 218 are formed alongside the sacrificial layers 206, (first) source/drain regions 220 are formed on opposite sides of the device stack 204/sacrificial gate 214 alongside the sacrificial layers 206 and active layers 208, and an interlayer dielectric 222 is deposited onto the device structure.

According to an exemplary embodiment, wafer 202 is a bulk semiconductor wafer, such as a bulk silicon (Si), bulk germanium (Ge), bulk silicon germanium (SiGe) and/or bulk III-V semiconductor wafer. Alternatively, wafer 202 can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor material(s), such as Si, Ge, SiGe and/or a III-V semiconductor. Further, wafer 202 may already have pre-built structures (not shown) such as transistors, diodes, capacitors, resistors, interconnects, wiring, etc.

As highlighted above, device stack 204 includes alternating sacrificial layers 206 and active layers 208 oriented horizontally one on top of another on the wafer 202. In one exemplary embodiment, the sacrificial layers 206 and active layers 208 are nanosheets. The term "nanosheet" as used herein, generally refers to a sheet or a layer having nanoscale dimensions. Further, the term "nanosheet" is meant to encompass other nanoscale structures such as nanowires. For instance, the term "nanosheet" can refer to a nanowire with a larger width, and/or the term "nanowire" can refer to a nanosheet with a smaller width, and vice versa.

As will be described in detail below, the sacrificial layers 206 will next be removed to permit the formation of a gate all around configuration for, in this case, the first/bottom transistor. By contrast, the active layers 208 will remain in place and serve as channels of the first/bottom transistor. Thus, the active layers 208 collectively may also be referred to herein generally as 'channels' of the first/bottom transistor. It is notable that the number of sacrificial layers 206 and active layers 208 shown is provided merely as an example to illustrate the present techniques. For instance, embodiments are contemplated herein where more or fewer sacrificial layers 206 and/or more or fewer active layers 208 are present than shown. According to an exemplary embodiment, each of the sacrificial layers 206 and each of the active layers 208 is deposited/formed on the wafer 202 using an epitaxial growth process. According to an exemplary embodiment, each of the sacrificial layers 206 and each of the active layers 208 has a thickness of from about 3 nanometers (nm) to about 25 nm.

The materials employed for the sacrificial layers 206 and active layers 208 are such that the sacrificial layers 206 can be removed selective to the active layers 208. For instance, according to an exemplary embodiment, the sacrificial layers 206 are each formed from SiGe, while the active layers 208 are formed from Si. Etchants such as wet hot SC1, vapor phase hydrogen chloride (HCl), vapor phase chlorine trifluoride ($ClF_3$) and other reactive clean processes (RCP) are selective for etching of SiGe versus Si. This is, however, only one exemplary combination of sacrificial/active material that may be employed in accordance with the present techniques. For instance, by way of example only, the opposite configuration can instead be implemented where the sacrificial layers 206 are each formed from Si, and the active layers 208 are each formed from SiGe.

According to an exemplary embodiment, the sacrificial gate oxide 210 is formed on the device stack 204 having a thickness of from about 1 nm to about 3 nm. Suitable materials for the sacrificial gate oxide 210 include, but are not limited to, SiOx. To form the sacrificial gate 214, a sacrificial gate material is first blanket deposited onto the device stack 204 over the sacrificial gate oxide 210. Suitable sacrificial gate materials include, but are not limited to, poly-silicon and/or amorphous silicon. A process such as chemical vapor deposition (CVD), atomic layer deposition (ALD), or physical vapor deposition (PVD) can be employed to deposit the sacrificial gate material onto the device stack 204.

The sacrificial gate hardmask 212 is then formed on the sacrificial gate material. Suitable materials for the sacrificial gate hardmask 212 include, but are not limited to, silicon nitride (SiN), silicon dioxide ($SiO_2$), titanium nitride (TiN) and/or silicon oxynitride (SiON). Standard lithography and etching techniques can be employed to pattern the sacrificial gate hardmask 212. With standard lithography and etching techniques, a lithographic stack (not shown), e.g., photoresist/anti-reflective coating/organic planarizing layer, is used to pattern the sacrificial gate hardmask 212 with the footprint and location of the sacrificial gate 214. Alternatively, the sacrificial gate hardmask 212 can be formed by other suitable techniques, including but not limited to, sidewall image transfer (SIT), self-aligned double patterning (SADP), self-aligned quadruple patterning (SAQP), and other self-aligned multiple patterning (SAMP). An etch employing the sacrificial gate hardmask 212 is then used to pattern the sacrificial gate material into the sacrificial gate 214 shown in FIGS. 2A-B.

To form the dielectric spacers 216, a dielectric spacer material is first deposited over the device stack 204, followed by a directional (anisotropic) etching process such as reactive ion etching to pattern the dielectric spacer material into the dielectric spacers 216 alongside the sacrificial gate hardmask 212 and sacrificial gate 214. Suitable dielectric spacer materials include, but are not limited to, SiOx, silicon carbide (SIC), silicon oxycarbide (SiCO), SiN, silicoboron carbonitride (SiBCN) and/or silicon oxycarbonitride (SiOCN), which can be deposited using a process such as CVD, ALD or PVD.

To form the inner spacers 218, a selective lateral etch is performed to first recess the sacrificial layers 206. This recess etch forms pockets along the sidewalls of the device stack 204 that are then filled with a dielectric spacer material to form the inner spacers 218 within the pockets. The inner spacers 218 will serve to offset the replacement metal gates (see below) from the source/drain regions 220. As provided above, the sacrificial layers 206 can be formed from SiGe. In that case, a SiGe-selective non-directional (isotropic) etching process can be used for the recess etch. Suitable dielectric spacer materials for inner spacers 218 include, but are not limited to, silicon nitride (SiN), SiOx. SiC and/or SiCO. A process such as CVD, ALD or PVD can be employed to deposit the dielectric spacer material into the pockets, after which excess spacer material can be removed using an isotropic etching process such as reactive ion etching.

According to an exemplary embodiment, the pFET and nFET source/drain regions 220 are each formed from an in-situ doped (i.e., during growth) or ex-situ doped (e.g., via ion implantation) epitaxial material such as epitaxial Si, epitaxial SiGe, etc. Suitable p-type dopants include, but are not limited to, boron (B). Suitable n-type dopants include, but are not limited to, phosphorous (P) and/or arsenic (As). With inner spacers 218 in place along the sidewalls of the device stack 204, epitaxial growth of the source/drain regions 220 is templated only from the ends of the active layers 208 along the sidewalls of the device stack 204.

Following formation of the source/drain regions 220, interlayer dielectric 222 is deposited onto the semiconductor device structure. Suitable interlayer dielectric 222 materials include, but are not limited to, silicon nitride (SiN), SiOC and/or oxide low-κ materials such as silicon oxide (SiOx) and/or oxide ultralow-κ interlayer dielectric (ULK-ILD) materials, e.g., having a dielectric constant κ of less than 2.7. Suitable ultralow-κ dielectric materials include, but are not limited to, porous organosilicate glass (pSiCOH), which can be deposited onto the semiconductor device structure using a process such as CVD, ALD or PVD.

Following deposition, the interlayer dielectric 222 can be polished using a process such as chemical mechanical polishing. According to an exemplary embodiment, this polishing of the interlayer dielectric 222 removes the sacrificial gate hardmask 212, thereby exposing the underlying sacrificial gate 214. See FIG. 3A (an X cross-sectional view) and FIG. 3B (a Y cross-sectional view).

Figure 4A:
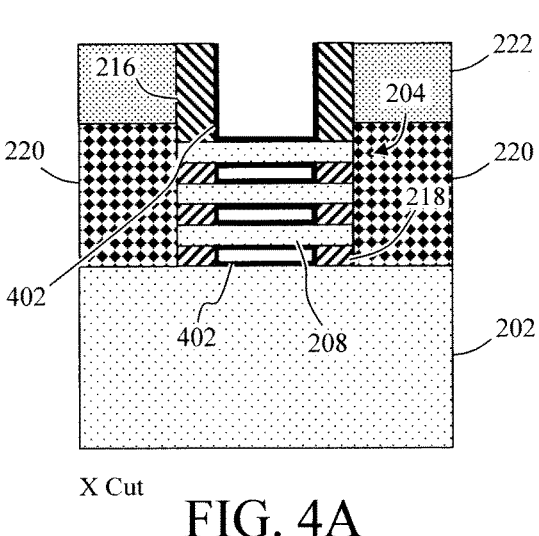
FIG. 4A is an X cross-sectional view and FIG. 4B is a Y cross-sectional view illustrating the first sacrificial gate/ sacrificial gate oxide and the first sacrificial layers having been selectively removed from the first device stack, and a (first) gate dielectric having been formed on the active layers and along the sidewalls of the first dielectric spacers and first inner spacers according to an embodiment of the present invention.
Figure 4B:
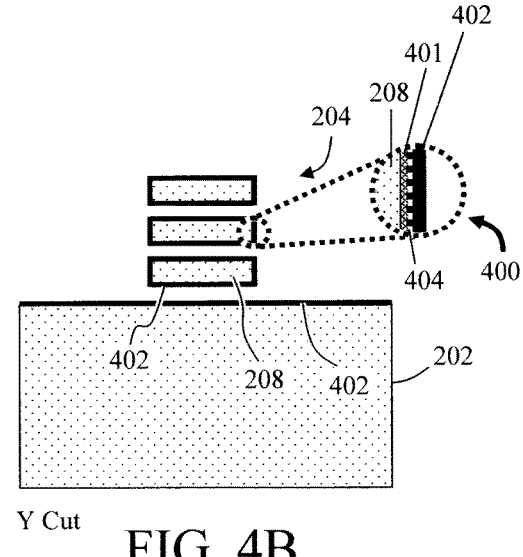

As shown in FIG. 4A (an X cross-sectional view) and FIG. 4B (a Y cross-sectional view), the sacrificial gate 214 and sacrificial gate oxide 210 are selectively removed from the device stack 204 exposing the underlying sacrificial layers 206 which are then removed from the device stack 204 selective to the active layers 208, and a (first) gate dielectric 402 is formed on the active layers 208 and along the sidewalls of the dielectric spacers 216 and inner spacers 218.

As provided above, the sacrificial gate 214 can be formed from poly-silicon and/or amorphous silicon. In that case, a poly-silicon and/or amorphous silicon-selective etch can be employed to remove the sacrificial gate 214 from the device stack 204. Likewise, an oxide-selective etching process may then be employed to remove the sacrificial gate oxide 210.

According to an exemplary embodiment, the sacrificial layers 206 are formed from SiGe, while the active layers 208 are formed from Si. In that case, etchants such as wet hot SC1, vapor phase HCl, vapor phase $ClF_3$ and/or other reactive clean processes can be employed to remove the sacrificial layers 206 selective to the active layers 208. Removal of the sacrificial layers 206 releases the active layers 208 from the device stack 204. These 'released' active layers 208 will be used to form the channels of the first/bottom transistor.

Referring to magnified view 400 in FIG. 4B, prior to depositing the gate dielectric 402, an interfacial layer 401 is preferably first formed on the active layers 208. Use of an interfacial layer 401 improves the channel/gate dielectric interface quality and channel carrier mobility. Suitable materials for the interfacial layer 401 include but are not limited to oxide materials such as SiOx. According to an exemplary embodiment, the interfacial layer 401 has a thickness of from about 0.5 nm to about 3 nm and ranges therebetween.

According to an exemplary embodiment, the thickness and/or composition of the interfacial layer 401 and/or the gate dielectric 402 in the first/bottom transistor can differ from the thickness and/or composition of the interfacial layer and/or the gate dielectric in the second/top transistor (see below). For instance, an optional dipole layer 404 can be deposited onto the interfacial layer 401 prior to the gate dielectric 402, with an anneal following deposition of the gate dielectric 402 to diffuse the metal or metals from the dipole layer 404 into the interfacial layer 401 and gate dielectric 402. Doing so can be used to tune the threshold voltage of the first/bottom transistor relative to the second/top transistor (see below). Suitable metals for the dipole layer 404 include, but are not limited to, lanthanum (La), yttrium (Y), magnesium (Mg) and/or gallium (Ga). By way of example only, the dipole layer 404 can have a thickness of from about 0.5 angstroms (Å) to about 30 Å. According to an exemplary embodiment, the anneal is performed at a temperature of from about 500° C. to about 1200° ° C., for a duration of from about 1 nanosecond to about 30 seconds. Preferably, the anneal is performed in the presence of an inert gas such as, but not limited to, nitrogen. As a result, the interfacial layer 401 and the gate dielectric 402 will each contain at least one dipole dopant, e.g., La, Y, Mg and/or Ga.

Preferably, different dipole dopants are used in the interfacial layer/gate dielectric in the bottom transistor vis-à-vis the top transistor in order to achieve different threshold voltages.

Additionally, the interfacial layer 401 and/or the gate dielectric 402 in the first/bottom transistor can optionally receive different treatments (e.g., oxidation and nitridation) from the interfacial layer and/or the gate dielectric in the second/top transistor. Namely, as provided above, the first/bottom transistor is of a first polarity (e.g., either pFET or nFET), while the second/top transistor is of a second/opposite polarity (either an nFET if the first/bottom transistor is a pFET or a pFET if the first/bottom transistor is an nFET). As such, the treatment performed on the interfacial layer 401 and/or the gate dielectric 402 can depend on whether the first/bottom transistor and the second/top transistor are a pFET and an nFET, or vice versa. For example, as will be described in detail below, nitridation is preferably performed only for the nFET interfacial layer and/or the gate dielectric, while the pFET interfacial layer and/or gate dielectric remains nitrogen-free.

Furthermore, even if the same material (e.g., $HfO_2$) is used as the gate dielectric 402 in the first/bottom transistor and as the gate dielectric in the second/top transistor, embodiments are contemplated herein where the gate dielectric used in the nFET transistor is thicker than the gate dielectric used in the pFET transistor. For example, as will be described in detail below, the thickness of the nFET gate dielectric is preferably from about 1 Å to about 2 Å greater than the thickness of the pFET gate dielectric.

In one exemplary embodiment, the gate dielectric 402 is a high-κ material. The term 'high-κ,' as used herein, refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, hafnium oxide ($HfO_2$), lanthanum oxide ($La_2O_3$), hafnium-lanthanum oxide ($HfLaO_2$), hafnium zirconium oxide ($HfZrO_2$) and/or hafnium aluminum oxide ($HfAlO_2$). A process such as CVD, ALD or PVD can be employed to deposit the gate dielectric 402. According to an exemplary embodiment, gate dielectric 402 has a thickness of from about 1 nm to about 5 nm and ranges therebetween.

Figure 5A:
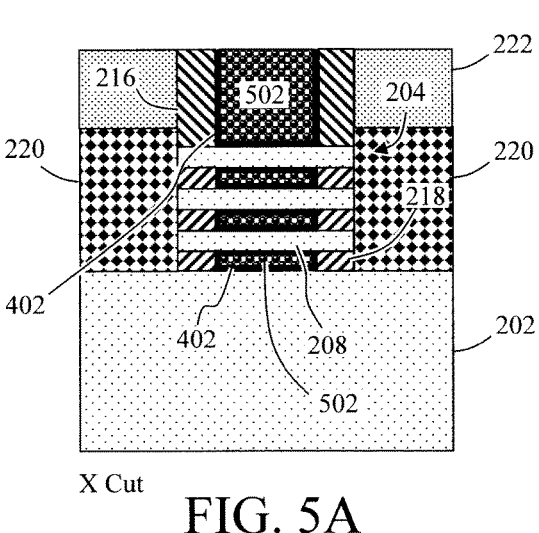
FIG. 5A is an X cross-sectional view and FIG. 5B is a Y cross-sectional view illustrating a (first/bottom) gate electrode having been formed on the first gate dielectric surrounding a portion of each of the first active layers in a gate all around configuration according to an embodiment of the present invention.
Figure 5B:
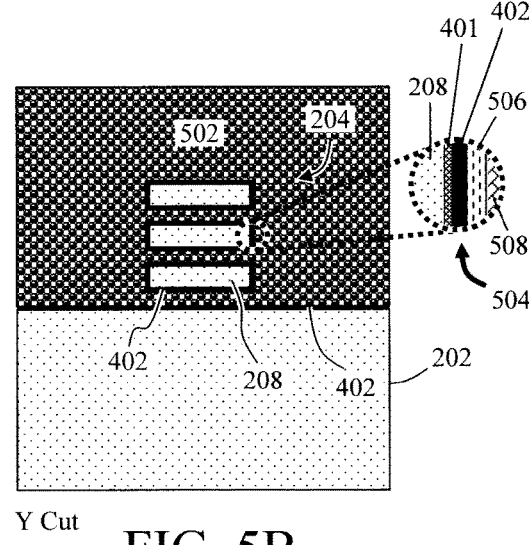

As shown in FIG. 5A (an X cross-sectional view) and FIG. 5B (a Y cross-sectional view), a (first/bottom) gate electrode 502 is next formed on the gate dielectric 402 surrounding a portion of each of the active layers 208 in a gate all around configuration. As shown in magnified view 504 in FIG. 5B, gate electrode 502 includes at least one workfunction-setting metal 506 disposed on the gate dielectric 402, and an optional (low-resistance) fill metal 508 disposed on the workfunction-setting metal(s) 506.

As highlighted above, the first/bottom transistor is a transistor of a first polarity (pFET or nFET) and the second/top transistor (see below) is a transistor of a second, opposite polarity (i.e., an nFET when the first/bottom transistor is a pFET or a pFET when the first/bottom transistor is an nFET). Thus, workfunction-setting metal(s) 506 is/are either p-type or n-type workfunction-setting metals depending on whether the respective transistor (in this case the first/bottom transistor) is a pFET or an nFET, respectively. Suitable (n-type) workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC), and/or titanium (Ti)-containing alloys such as titanium carbide (TiC) and/or tantalum titanium (TaTi). Suitable (p-type) workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above. It is notable, however, that this is not an exhaustive list and that these workfunction-setting metals are not meant to be exclusive to transistors of one polarity. e.g., TiAlC can be implemented as a workfunction-setting metal in both nFET and pFET transistors. A process such as CVD, ALD or PVD can be employed to deposit the workfunction-setting metal(s) 506. As will be described in detail below, the thickness and/or composition of the workfunction-setting metal(s) 506 in the first/bottom transistor can differ from the thickness and/or composition of the workfunction-setting metal(s) in the second/top transistor (see below).

Suitable low-resistance fill metals 508 include, but are not limited to, W, cobalt (Co), ruthenium (Ru) and/or Al. The low-resistance fill metals 508 can be deposited using a process or combination of processes including, but not limited to, CVD, ALD, PVD, sputtering, plating, evaporation, ion beam deposition, electron beam deposition, laser assisted deposition, chemical solution deposition, etc.

As such, according to the above-described exemplary embodiment, the replacement metal gate of the first/bottom transistor includes interfacial layer 401 disposed on the active layers 208 of the device stack 204, the gate dielectric 402 surrounding the active layers 208 over the interfacial layer 401, and the gate electrode 502 disposed on the gate dielectric 402 surrounding a portion of each of the active layers 208 in a gate all around configuration. The gate electrode 502 includes the at least one of workfunction-setting metal(s) 506 disposed on the gate dielectric 402, and the optional (low-resistance) fill metal 508 disposed on the workfunction-setting metal(s) 506.

Figure 6A:
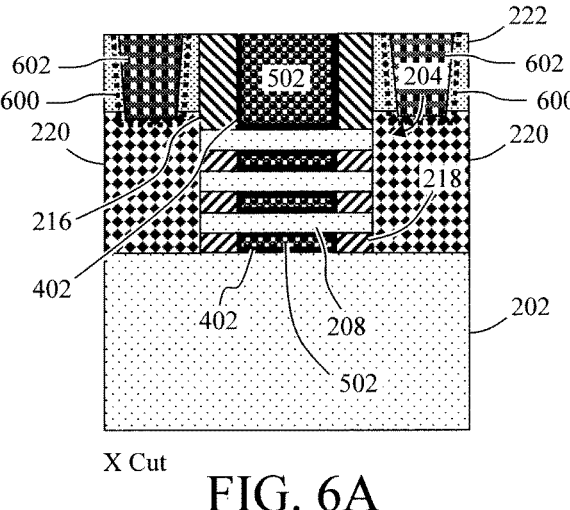
FIG. 6A is an X cross-sectional view and FIG. 6B is a Y cross-sectional view illustrating interconnects having been formed in the interlayer dielectric that directly contact the first source/drain regions according to an embodiment of the present invention.
Figure 6B:
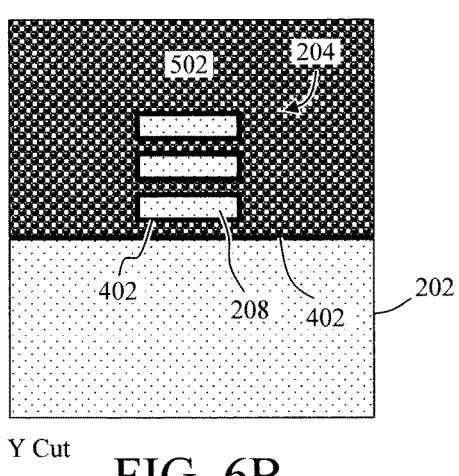

As shown in FIG. 6A (an X cross-sectional view) and FIG. 6B (a Y cross-sectional view), interconnects 602 are then formed in the interlayer dielectric 222 that directly contact the source/drain regions 220. To form the interconnects 602 in the interlayer dielectric 222, standard lithography and etching techniques (see above) can be employed to pattern features 600 (e.g., trenches and/or vias) in the interlayer dielectric 222. The features 600 are then filled with a contact metal(s) to form the interconnects 602. Suitable contact metals include, but are not limited to, copper (Cu), nickel (Ni), platinum (Pt), ruthenium (Ru), cobalt (Co) and/or tungsten (W), which can be deposited using a process such as evaporation, sputtering, or electrochemical plating. Following deposition, the metal overburden can be removed using a process such as chemical-mechanical polishing.

Prior to depositing the contact metal(s) into the features 600, a conformal barrier layer (not shown) can be deposited into and lining the features 600. Use of such a barrier layer helps to prevent diffusion of the contact metal(s) into the surrounding interlayer dielectric 222. Suitable barrier layer materials include, but are not limited to, Ru, tantalum (Ta), tantalum nitride (TaN), titanium (Ti), and/or titanium nitride (TiN). Additionally, a seed layer (not shown) can be deposited into and lining the features 600 prior to deposition of the contact metal(s). A seed layer facilitates plating of the contact metal(s) into the features 600.

As shown in FIGS. 6A-B, at this stage in the process, the first/bottom transistor includes the dielectric spacers 216/inner spacers 218 above/between the active layers 208, the source/drain regions 220 interconnected by the active layers 208, the interlayer dielectric 222 disposed on the source/drain regions 220, the gate dielectric 402 disposed on the active layers 208 and along the sidewalls of the dielectric spacers 216 and inner spacers 218, and the gate electrode 502 disposed on the gate dielectric 402 surrounding a portion of each of the active layers 208 in a gate all around configuration.

The same above-described process is also performed to fabricate a second/top transistor on a wafer 702. See FIG. 7A (an X cross-sectional view) and FIG. 7B (a Y cross-sectional view). Since the second/top transistor is formed in the same manner as the first/bottom transistor, for brevity the individual steps are combined into a single figure. Further, unless noted, the materials and fabrication processes employed are the same as those used during fabrication of the first/bottom transistor.

Figure 7A:
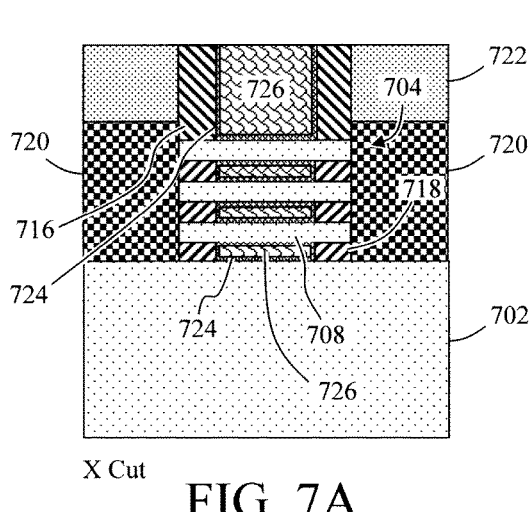
FIG. 7A is an X cross-sectional view and FIG. 7B is a Y cross-sectional view illustrating a second/top transistor having been formed on a wafer that includes (second) dielectric spacers/inner spacers above/between (second) active layers, (second) source/drain regions interconnected by the second active layers, a (second) gate dielectric disposed on the second active layers and along the sidewalls of the second dielectric spacers and inner spacers, and a (second/top) gate electrode disposed on the second gate dielectric surrounding a portion of each of the second active layers in a gate all around configuration according to an embodiment of the present invention.
Figure 7B:
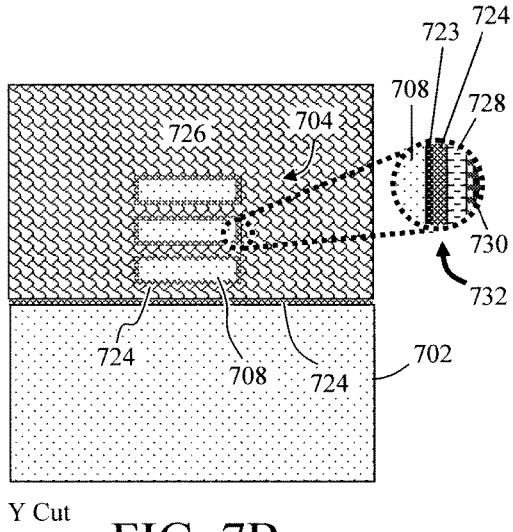
Figure 10:
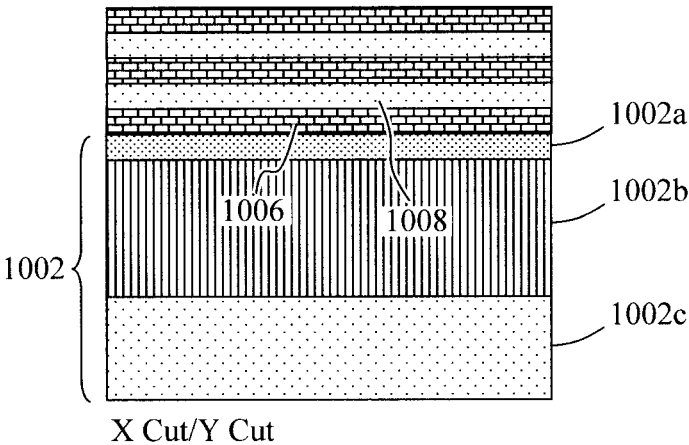
FIG. 10 is both an X and a Y cross-sectional view illustrating a (second) stack of alternating (second) sacrificial layers and (second) active layers having been formed on a (second) wafer according to an embodiment of the present invention.

Specifically, as shown in FIGS. 7A-B, the second/top transistor includes a (second) device stack 704 on the wafer 702 having (second) active layers 708, dielectric spacers 716/inner spacers 718 above/between active layers 708, source/drain regions 720 interconnected by the active layers 708, an interlayer dielectric 722 disposed on the source/drain regions 720, a (second) gate dielectric 724 disposed on the active layers 708 and along the sidewalls of the dielectric spacers 716 and inner spacers 718, and a (second/top) gate electrode 726 disposed on the gate dielectric 724 surrounding a portion of each of the active layers 708 in a gate all around configuration. As above, the active layers 708 collectively may also be referred to herein generally as 'channels' of the second/top transistor. It is to be understood that components such as sacrificial layers in the device stack 704, a sacrificial gate oxide, a sacrificial gate hardmask/sacrificial gate have been implemented in the same manner as described above, but are no longer present at this stage of the process flow.

Referring to magnified view 732 in FIG. 7B, prior to depositing the gate dielectric 724, an interfacial layer 723 is preferably first formed on the active layers 708. As provided above, the use of an interfacial layer 723 improves the channel/gate dielectric interface quality and channel carrier mobility. Suitable materials for the interfacial layer 723 include, but are not limited to, oxide materials such as SiOx. According to an exemplary embodiment, the interfacial layer 723 has a thickness of from about 0.5 nm to about 3 nm and ranges therebetween.

According to an exemplary embodiment, the thickness and/or composition of the interfacial layer 723 and/or the gate dielectric 724 in the second/top transistor differ from the thickness and/or composition of the interfacial layer 401 and/or the gate dielectric 402 in the first/bottom transistor. For instance, the interfacial layer 723 and the gate dielectric 724 can each optionally contain at least one dipole dopant such as La, Y, Mg and/or Ga to tune the threshold voltage of the second/top transistor relative to the first/bottom transistor. Namely, in the same manner as described above, a dipole layer (not shown) can be implemented between the interfacial layer 723 and the gate dielectric 724, followed by an anneal (sec above) to diffuse the metal(s) from that dipole layer into the interfacial layer 723 and the gate dielectric 724.

Additionally, the interfacial layer 723 and/or the gate dielectric 724 in the second/top transistor can optionally receive different treatments (e.g., oxidation and nitridation) from the interfacial layer 401 and/or the gate dielectric 402 in the first/bottom transistor. Namely, as provided above, the first/bottom transistor is of a first polarity (e.g., either pFET or nFET), while the second/top transistor is of a second/ opposite polarity (either an nFET if the first/bottom transistor is a pFET or a pFET if the first/bottom transistor is an nFET). As such, the treatment performed on the interfacial layer 723 and/or the gate dielectric 724 can depend on whether the second/top transistor and the first/bottom transistor are a pFET and an nFET, or vice versa. For example, if the second/top transistor and the first/bottom transistor are a pFET and an nFET, respectively, then the interfacial layer 723 and/or the gate dielectric 724 in the second/top transistor (in this case a pFET) might receive an oxidation treatment, whereas the interfacial layer 401 and/or the gate dielectric 402 in the first/bottom transistor (in this case an nFET) would receive a nitridation treatment. As a result, the interfacial layer 401 and/or the gate dielectric 402 in the first/bottom transistor would contain nitrogen (e.g., nitrogen-doped $HfO_2$), whereas the interfacial layer 723 and/or the gate dielectric 724 in the second/top transistor would be nitrogen free. Conversely, if the second/top transistor and the first/bottom transistor are an nFET and a pFET, respectively, then the interfacial layer 723 and/or the gate dielectric 724 in the second/top transistor (in this case an nFET) might receive a nitridation treatment, whereas the interfacial layer 401 and/or the gate dielectric 402 in the first/bottom transistor (in this case a pFET) would receive an oxidation treatment. As a result, the interfacial layer 401 and/or the gate dielectric 402 in the first/bottom transistor would be nitrogen free, whereas the interfacial layer 723 and/or the gate dielectric 724 in the second/top transistor contain nitrogen (e.g., nitrogen-doped $HfO_2$).

Furthermore, even if the same material (e.g., $HfO_2$) is used as the gate dielectric 402 in the first/bottom transistor and as the gate dielectric 724 in the second/top transistor, embodiments are contemplated herein where the gate dielectric used in the nFET transistor is thicker than the gate dielectric used in the pFET transistor. For example, if the first/bottom transistor and the second/top transistor are an nFET and a pFET, respectively, then the thickness of the gate dielectric 402 in the first/bottom transistor (in this case an nFET) is preferably from about 1 Å to about 2 Å greater than the thickness of the gate dielectric 724 in the second/top transistor (in this case a pFET). Conversely, if the first/ bottom transistor and the second/top transistor are a pFET and as nFET, respectively, then the thickness of the gate dielectric 724 in the second/top transistor (in this case an nFET) is preferably from about 1 Å to about 2 Å greater than the thickness of the gate dielectric 402 in the first/bottom transistor (in this case a pFET).

As also shown in magnified view 732 in FIG. 7B, the gate electrode 726 includes at least one workfunction-setting metal 728 disposed on the gate dielectric 724, and an optional (low-resistance) fill metal 730 disposed on the workfunction-setting metal(s) 728. Suitable n-type and p-type workfunction-setting metals and suitable fill metals were provided above.

According to an exemplary embodiment, the thickness and/or composition of the workfunction-setting metal(s) 728 in the second/top transistor differ from the thickness and/or composition of the workfunction-setting metal(s) 506 in the first/bottom transistor. For instance, to use an illustrative, non-limiting example, both the workfunction-setting metal(s) 728 in the second/top transistor and the workfunction-setting metal(s) 506 in the first/bottom transistor can include TiAlC. However, the thickness of the TiAlC in the pFET is preferably less than the thickness of the TiAlC in the nFET. Further, when used as the pFET workfunction-setting metal, the concentration of Al in the TiAlC is preferably lower than when it is used as nFET workfunction-setting metal.

As such, according to the above-described exemplary embodiment, the replacement metal gate of the second/top transistor includes interfacial layer 723 disposed on the active layers 708 of the device stack 704, the gate dielectric 724 surrounding the active layers 708 over the interfacial layer 723, and the gate electrode 726 disposed on the gate dielectric 724 surrounding a portion of each of the active layers 708 in a gate all around configuration. The gate electrode 726 includes the at least one of workfunction-setting metal(s) 728 disposed on the gate dielectric 724, and the optional (low-resistance) fill metal 730 disposed on the workfunction-setting metal(s) 728.

As shown in FIG. 8A (an X cross-sectional view) and FIG. 8B (a Y cross-sectional view), the wafer 702 is removed, and the second/top transistor is bonded to the top of the first/bottom transistor via a bonding layer 802, and interconnects 806 and 808 are formed which directly contact the source/drain regions 720 and gate electrode 726, respectively. As shown in FIGS. 8A-B, the bonding layer 802 is present over the dielectric spacers 216, the gate electrode 502 and interconnects 602 of the first/bottom transistor, and under the inner spacers 718, the source/drain regions 720 and gate electrode 726 of the second/top transistor. According to an exemplary embodiment, the bonding layer 802 is formed from an oxide material such as $SiO_2$, and a standard oxide-to-oxide bonding process is employed to bond the second/top transistor to the first/bottom transistor.

In order to form the interconnects 806 and 808, an interlayer dielectric 804 is first deposited onto the second/ top transistor over the dielectric spacers 716 and gate electrode 726. Suitable interlayer dielectric 804 materials include, but are not limited to, SiN, SiOC and/or oxide low-κ materials such as SiOx and/or ULK-ILD materials such as pSiCOH, which can be deposited using a process such as CVD, ALD or PVD. Following deposition, the interlayer dielectric 804 can be polished using a process such as chemical mechanical polishing.

Interconnects 806 and 808 are then formed in the interlayer dielectric 804. To do so, standard lithography and etching techniques (see above) are employed to pattern features 805 (e.g., trenches and/or vias) in the interlayer dielectric 804. The features 805 are then filled with a contact metal(s) to form the interconnects 806 and 808. As provided above, suitable contact metals include, but are not limited to, Cu, Ni, Pt, Ru. Co and/or W, which can be deposited using a process such as evaporation, sputtering, or electrochemical plating. Following deposition, the metal overburden can be removed using a process such as chemical-mechanical polishing.

Prior to depositing the contact metal(s) into the features 805, a conformal barrier layer (not shown) can be deposited into and lining the features 805. Use of such a barrier layer helps to prevent diffusion of the contact metal(s) into the surrounding interlayer dielectric 804. As provided above, suitable barrier layer materials include, but are not limited to, Ru, Ta, TaN, Ti, and/or TiN. Additionally, a seed layer (not shown) can be deposited into and lining the features 805 prior to deposition of the contact metal(s). A seed layer facilitates plating of the contact metal(s) into the features 805.

As shown in FIGS. 8A-B, at this stage in the process, the second/top transistor includes the dielectric spacers 716/inner spacers 718 above/between the active layers 708, the source/drain regions 720 interconnected by the active layers 708, the interlayer dielectric 722 disposed on the source/drain regions 720, the gate dielectric 724 disposed on the active layers 708 and along the sidewalls of the dielectric spacers 716 and inner spacers 718, and the gate electrode 726 disposed on the gate dielectric 724 surrounding a portion of each of the active layers 708 in a gate all around configuration.

Further, it can be seen in FIGS. 8A-B that bonding two nearly-complete first/bottom and second/top transistors in this manner results in identical gate dielectric shapes in the first/bottom and second/top transistors. For instance, gate dielectric 402 of the first/bottom transistor has what is referred to herein as a 'U-shape' over the active layers 208. Namely, over the active layers 208, the gate dielectric 402 is present along the bottom and opposite sidewalls of the gate electrode 502 thereby forming the letter 'U'. Likewise, gate dielectric 724 of the second/top transistor also has a U-shape over the active layers 708. Namely, over the active layers 708, the gate dielectric 724 is present along the bottom and opposite sidewalls of the gate electrode 726 thereby forming the letter 'U'. However, as provided above, the interfacial layer 401 and/or gate dielectric 402 can have a different composition and/or thickness from the interfacial layer 723 and/or gate dielectric 724. Further, the stacked FET design shown in FIGS. 8A-B has a unique orientation of components where the dielectric spacers 216 and the gate electrode 502 of the first/bottom transistor both directly contact the bonding layer 802, whereas the inner spacers 718 and the source/drain regions 720 of the second/top transistor both directly contact the bonding layer 802. The gate electrode 726 of the second/top transistor is, however, separated from the bonding layer 802 by the gate dielectric 724.

According to an alternative embodiment now described by way of reference to FIGS. 9-26, wafer bonding will be employed earlier in the process followed by construction of the first/bottom and second/top transistors on opposite sides of the bonding layer. As will be described in detail below, this alternative process flow will result in different gate dielectric shapes that are mirror images of one another. The same X and Y cross-sectional views will be presented in the figures below, and these cross-sectional views follow the same corresponding orientations depicted in FIG. 1.

As shown in FIG. 9 (which appears the same for either an X cross-sectional view or a Y cross-sectional view), the process begins with the formation of a (first) stack of alternating (first) sacrificial layers 906 and (first) active layers 908 oriented horizontally one on top of another on a (first) wafer 902. In the present example, wafer 902 is a semiconductor-on-insulator (SOI) wafer having an SOI layer 902a separated from an underlying substrate 902c by a buried insulator 902b. When the buried insulator 902b is an oxide it is also referred to herein as a buried oxide or BOX. According to an exemplary embodiment, the SOI layer 902a includes a semiconductor material(s), such as Si and/or SiGe. Further, wafer 902 may already have pre-built structures (not shown) such as transistors, diodes, capacitors, resistors, interconnects, wiring, etc.

In one exemplary embodiment, the sacrificial layers 906 and SOI layer 902a/active layers 908 are nanosheets. It is notable that the number of sacrificial layers 906 and active layers 908 shown is provided merely as an example to illustrate the present techniques. For instance, embodiments are contemplated herein where more or fewer sacrificial layers 906 and/or more or fewer active layers 908 are present than shown. According to an exemplary embodiment, each of the sacrificial layers 906 and each of the active layers 908 is deposited/formed on the wafer 902 using an epitaxial growth process. According to an exemplary embodiment, the SOI layer 902a, each of the sacrificial layers 906 and each of the active layers 908 has a thickness of from about 3 nm to about 25 nm.

The materials employed for the sacrificial layers 906 and active layers 908 are such that the sacrificial layers 906 can be removed selective to the active layers 908. For instance, according to an exemplary embodiment, the sacrificial layers 906 are each formed from SiGe, while the active layers 908 are formed from Si. In that case, SOI layer 902a would also be formed from Si. As will become apparent from the description to follow, the SOI layer 902a will also serve as an active layer in the transistor to be formed. Thus, SOI layer 902a may also be referred to herein generally as one of the active layers, and those active layers collectively may also be referred to herein generally as 'channels' of the respective transistor. As provided above, etchants such as wet hot SC1, vapor phase HCl, vapor phase $ClF_3$ and other reactive clean processes (RCP) are selective for etching of SiGe versus Si. This is, however, only one exemplary combination of sacrificial/active material that may be employed in accordance with the present techniques. For instance, by way of example only, the opposite configuration can instead be implemented where the sacrificial layers 906 are each formed from Si, and the active layers 908 (and the SOI layer 902a) are each formed from SiGe.

The same above-described process is also performed to form a (second) stack of alternating (second) sacrificial layers 1006 and (second) active layers 1008 oriented horizontally one on top of another on a (second) wafer 1002, i.e., an SOI wafer having an SOI layer 1002a (e.g., Si and/or SiGe) separated from an underlying substrate 1002c by a buried insulator 1002b (e.g., a BOX). See FIG. 10 (which appears the same for either an X cross-sectional view or a Y cross-sectional view). According to an exemplary embodiment, the sacrificial layers 1006 are each formed from SiGe, while the active layers 1008 are formed from Si. In that case, SOI layer 1002a would also be formed from Si. As will become apparent from the description to follow, the SOI layer 1002a will also serve as an active layer in the transistor to be formed. Thus, SOI layer 1002a may also be referred to herein generally as one of the active layers, and those active layers collectively may also be referred to herein generally as 'channels' of the respective transistor. However, as provided above, the opposite configuration can instead be implemented where the sacrificial layers 1006 are each formed from Si, and the active layers 1008 (and the SOI layer 1002a) are each formed from SiGe.

Figure 11:
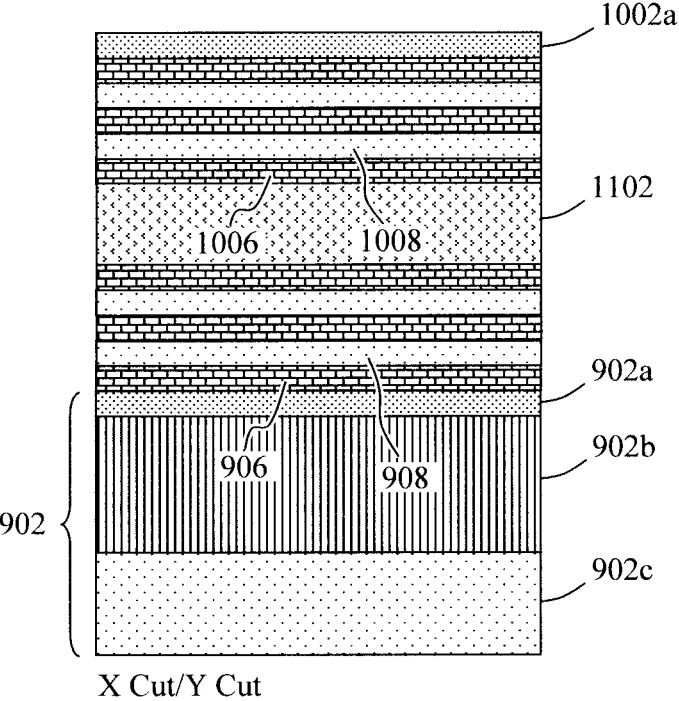
FIG. 11 is both an X and a Y cross-sectional view illustrating the second wafer having been removed, and the second stack of second sacrificial layers and second active layers having been bonded to the top of the first stack of first sacrificial layers and first active layers via a bonding layer according to an embodiment of the present invention.

As shown in FIG. 11 (which appears the same for either an X cross-sectional view or a Y cross-sectional view), the wafer 1002 is removed, and the stack of sacrificial layers 1006 and active layers 1008 is bonded to the top of the stack of sacrificial layers 906 and active layers 908 via a bonding layer 1102. Doing so involves inverting the stack of sacrificial layers 1006 and active layers 1008. Namely, as shown in FIG. 11, the sacrificial layer 1006 originally at the top of the (second) stack is now present on the bonding layer 1102, while the SOI layer 1002a is at the top of the second stack. According to an exemplary embodiment, the bonding layer 1102 is formed from an oxide material such as $SiO_2$, and a standard oxide-to-oxide bonding process is employed to bond the second stack to the first stack.

Figures 12A, 12B:
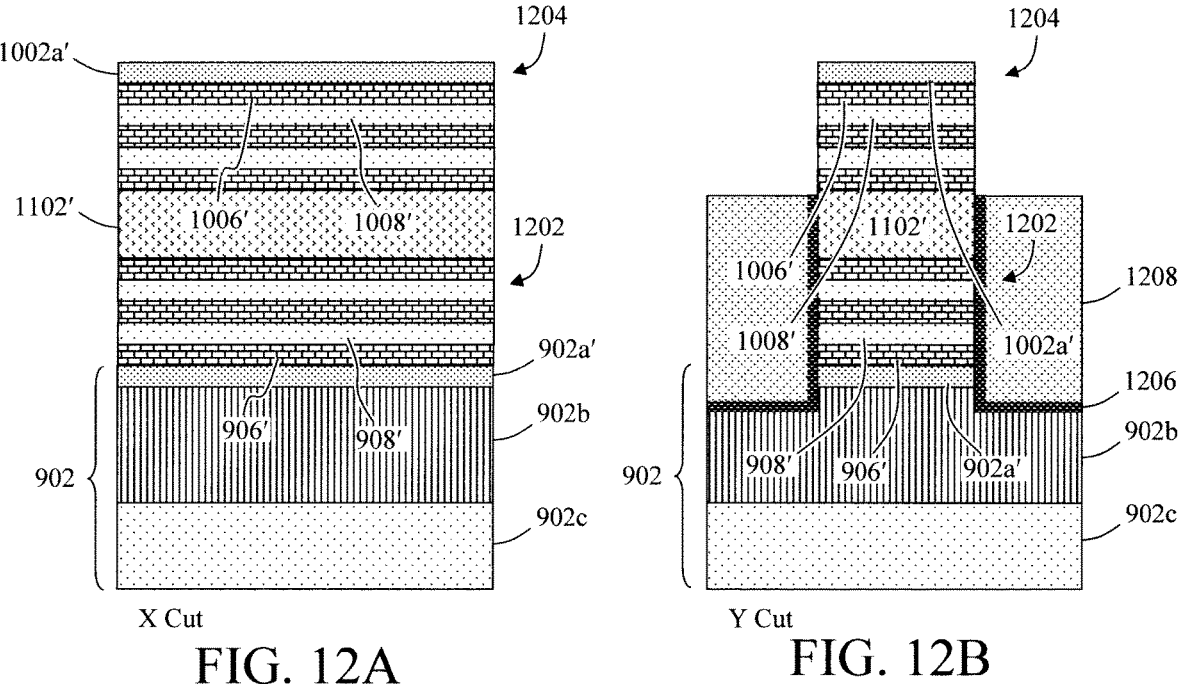
FIG. 12A is an X cross-sectional view and FIG. 12B is a Y cross-sectional view illustrating the first and second stacks having been patterned into at least an individual first device stack and second device stack, and shallow trench isolation regions having been formed alongside the first device stack according to an embodiment of the present invention.

As shown in FIG. 12A (an X cross-sectional view) and FIG. 12B (a Y cross-sectional view), standard lithography and etching techniques (see above) are employed to pattern the first and second stacks into at least an individual first device stack 1202 and second device stack 1204, and shallow trench isolation regions 1208 are formed alongside the first device stack 1202. As such, the first device stack 1202 will contain patterned portions 902a', 906' and 908' of the SOI layer 902a, sacrificial layers 906 and active layers 908, respectively. Likewise, the second device stack 1204 will contain patterned portions 1002a'. 1006' and 1008' of the SOI layer 1002a, sacrificial layers 1006 and active layers 1008, respectively. A patterned portion 1102' of the bonding layer 1102 is present between the first device stack 1202 and second device stack 1204. As its name implies, a 'patterned portion' refers to some portion of a larger component obtained after the larger component is patterned. Thus, the composition, thickness, etc. of a given patterned portion is assumed to be the same as the larger component from which it is obtained. As such, in the final product, these patterned portions may also be referred to simply by the name of the original component. For example, the patterned portions 902a' of the SOI layer and the patterned portions 908' of the active layers may also be referred to herein simply as the SOI layer and the active layers, respectively, or even collectively as just 'channels.' Similarly, the patterned portions 1002a' of the SOI layer and the patterned portions 1008' of the active layers may also be referred to herein simply as the SOI layer and the active layers, respectively, or even collectively as just 'channels.' As will be described in detail below, the present process flow will involve later flipping the structure such that the first device stack 1202 will be above the second device stack 1204. To look at it another way, the second device stack 1204 will ultimately form the bottom transistor and the first device stack 1202 will ultimately form the top transistor in the stacked FET design.

To form the shallow trench isolation regions 1208, a liner 1206 (e.g., a thermal oxide or silicon nitride (SiN)) is first deposited on the buried insulator 902b and alongside the first device stack 1202/second device stack 1204/bonding layer 1102. An oxide (which may also be generally referred to herein as a 'shallow trench isolation oxide') is then deposited over the liner 1206 followed by planarization and recess of the shallow trench isolation oxide and liner 1206. Suitable shallow trench isolation oxides include, but are not limited to, oxide low-κ materials such as silicon oxide SiOx and/or oxide ULK-ILD materials such as pSiCOH. A process such as CVD, ALD or PVD can be employed to deposit the shallow trench isolation oxide, after which the shallow trench isolation oxide can be planarized using a process such as chemical mechanical polishing. The shallow trench isolation oxide and liner 1206 are then recessed using a dry or wet etch process. As shown in FIGS. 12A-B, the shallow trench isolation oxide and liner 1206 are recessed below a top surface of the patterned portion 1102' of the bonding layer.

Figures 13A, 13B:
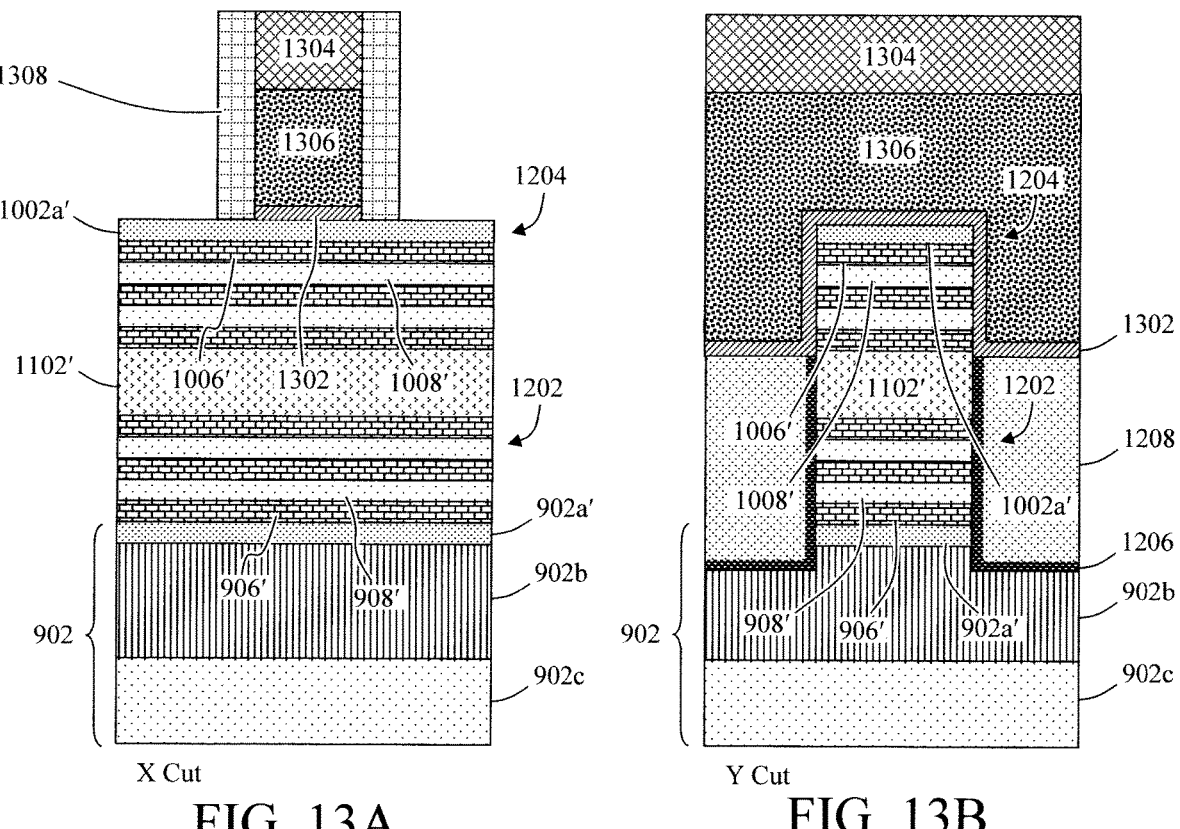
FIG. 13A is an X cross-sectional view and FIG. 13B is a Y cross-sectional view illustrating a sacrificial gate oxide having been formed on the second device stack, a sacrificial gate having been formed on the second device stack over the sacrificial gate oxide using a sacrificial gate hardmask, and dielectric spacers having been formed alongside the sacrificial gate hardmask and sacrificial gate according to an embodiment of the present invention.

As shown in FIG. 13A (an X cross-sectional view) and FIG. 13B (a Y cross-sectional view), a sacrificial gate oxide 1302 is formed on the second device stack 1204, a sacrificial gate 1306 is formed on the second device stack 1204 over the sacrificial gate oxide 1302 using a sacrificial gate hardmask 1304, and dielectric spacers 1308 are formed alongside the sacrificial gate hardmask 1304 and sacrificial gate 1306. According to an exemplary embodiment, the sacrificial gate oxide 1302 is formed on the second device stack 1204 having a thickness of from about 1 nm to about 3 nm. Suitable materials for the sacrificial gate oxide 1302 include, but are not limited to. SiOx.

To form the sacrificial gate 1306, a sacrificial gate material is first blanket deposited onto the second device stack 1204 over the sacrificial gate oxide 1302. Suitable sacrificial gate materials include, but are not limited to, poly-silicon and/or amorphous silicon. A process such as CVD. ALD or PVD can be employed to deposit the sacrificial gate material onto the second device stack 1204.

The sacrificial gate hardmask 1304 is then formed on the sacrificial gate material. Suitable materials for sacrificial gate hardmask 1304 include, but are not limited to, SiN, $SiO_2$, TiN and/or SiON. Standard lithography and etching techniques (see above) can be employed to pattern the sacrificial gate hardmask 1304. Alternatively, the sacrificial gate hardmask 1304 can be formed by other suitable techniques, including but not limited to, SIT, SADP, SAQP, and other self-aligned multiple patterning (SAMP). An etch employing the sacrificial gate hardmask 1304 is then used to pattern the sacrificial gate material into the sacrificial gate 1306 shown in FIGS. 13A-B.

To form the dielectric spacers 1308, a dielectric spacer material is first deposited over the second device stack 1204, followed by a directional (anisotropic) etching process such as reactive ion etching to pattern the dielectric spacer material into the dielectric spacers 1308 alongside the sacrificial gate hardmask 1304 and sacrificial gate 1306. Suitable dielectric spacer materials include, but are not limited to, SiOx, SiC, SiCO, SiN, SiBCN and/or SiOCN, which can be deposited using a process such as CVD, ALD or PVD.

Figures 14A, 14B:
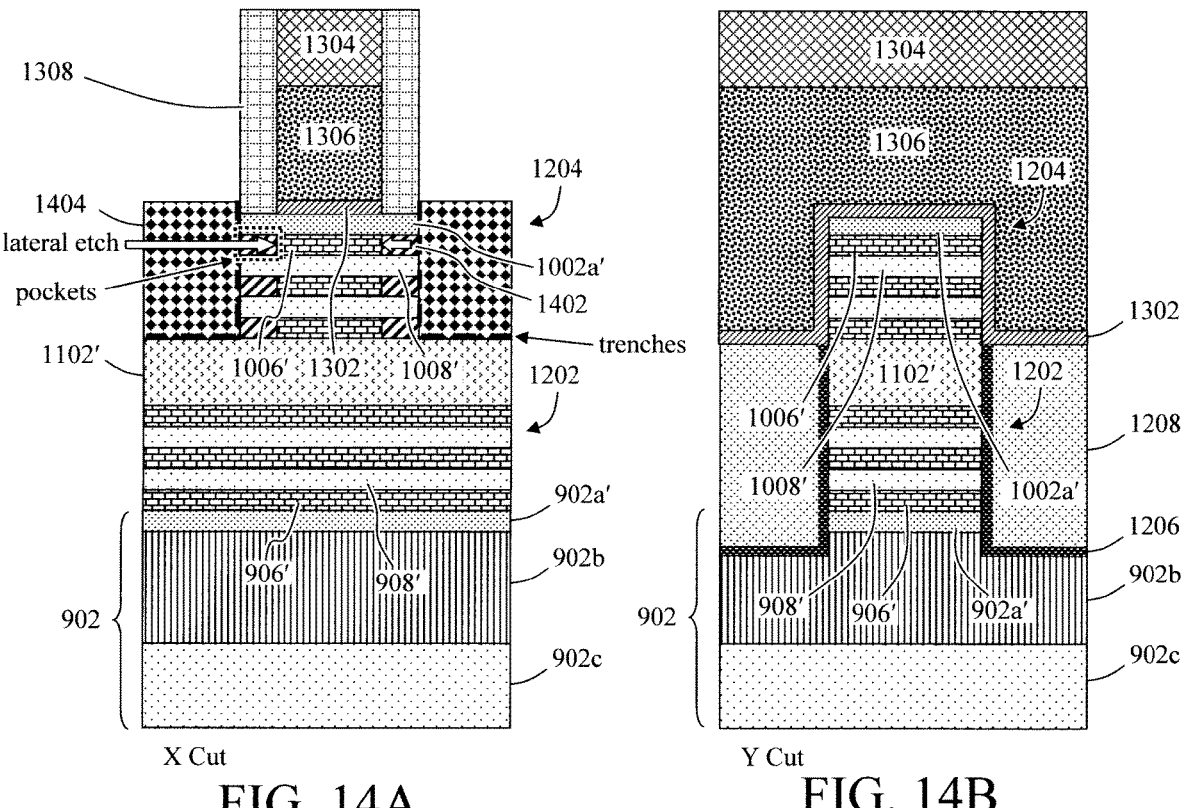
FIG. 14A is an X cross-sectional view and FIG. 14B is a Y cross-sectional view illustrating trenches having been patterned in the second device stack, inner spacers having been formed alongside patterned portions of the second sacrificial layers in the trenches, and source/drain regions having been formed in the trenches according to an embodiment of the present invention.

As shown in FIG. 14A (an X cross-sectional view) and FIG. 14B (a Y cross-sectional view), the sacrificial gate hardmask 1304/sacrificial gate 1306/dielectric spacers 1308 are used as a mask to pattern trenches (outlined with dashed lines) in the second device stack 1204, inner spacers 1402 are formed alongside the patterned portions 1006' of the sacrificial layers in the trenches, and source/drain regions 1404 are formed in the trenches on opposite sides of the sacrificial gate 1306 alongside the patterned portions 1006' of the sacrificial layers and patterned portions 1002a'/1008' of the SOI layer/active layers.

To form the inner spacers 1402, a selective lateral etch is performed to first recess the patterned portions 1006' of the sacrificial layers in the trenches. This recess etch forms pockets along the sidewalls of the second device stack 1204 that are then filled with a dielectric spacer material to form the inner spacers 1402 within the pockets. The inner spacers 1402 will serve to offset the replacement metal gates (see below) from the source/drain regions 1404. As provided above, the patterned portions 1006' of the sacrificial layers can be formed from SiGe. In that case, a SiGe-selective non-directional (isotropic) etching process can be used for the recess etch. Suitable dielectric spacer materials for inner spacers 1402 include, but are not limited to, SiN. SiOx, SiC and/or SiCO. A process such as CVD. ALD or PVD can be employed to deposit the dielectric spacer material into the pockets, after which excess spacer material can be removed using an isotropic etching process such as reactive ion etching.

According to an exemplary embodiment, the source/drain regions 1404 are formed from an in-situ doped (i.e., during growth) or ex-situ doped (e.g., via ion implantation) epitaxial material such as epitaxial Si, epitaxial SiGe, etc. Suitable p-type dopants include, but are not limited to, boron (B). Suitable n-type dopants include, but are not limited to, phosphorous (P) and/or arsenic (As). With inner spacers 1402 in place along the sidewalls of the second device stack 1204, epitaxial growth of the source/drain regions 1404 is templated only from the ends of the patterned portions 1002a'/1008' of the SOI layer/active layers along the sidewalls of the second device stack 1204.

Figures 15A, 15B:
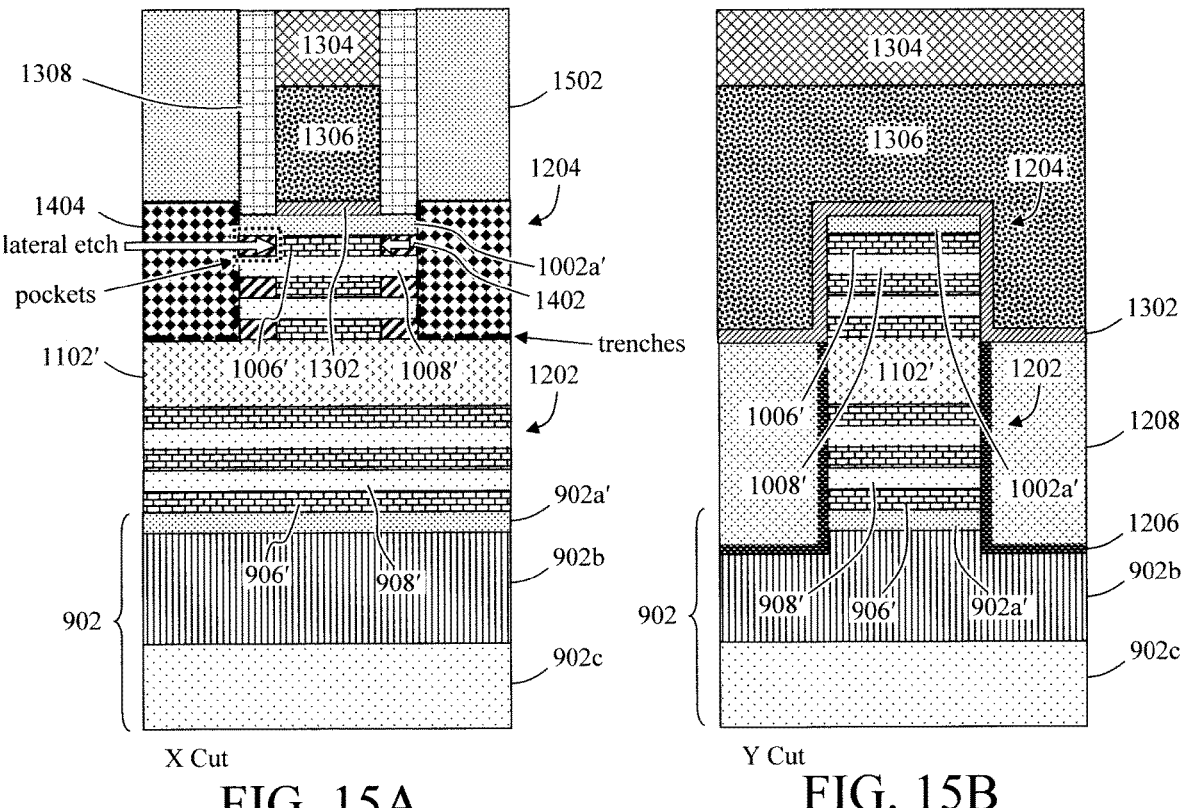
FIG. 15A is an X cross-sectional view and FIG. 15B is a Y cross-sectional view illustrating an interlayer dielectric having been deposited over the source/drain regions according to an embodiment of the present invention.

As shown in FIG. 15A (an X cross-sectional view) and FIG. 15B (a Y cross-sectional view), an interlayer dielectric 1502 is then deposited over the source/drain regions 1404. Suitable interlayer dielectric 1502 materials include, but are not limited to, SiN, SiOC and/or oxide low-κ materials such as SiOx and/or oxide ULK-ILD materials such as pSiCOH, which can be deposited using a process such as CVD, ALD or PVD. Following deposition, the interlayer dielectric 1502 can be planarized using a process such as chemical mechanical polishing.

Figures 16A, 16B:
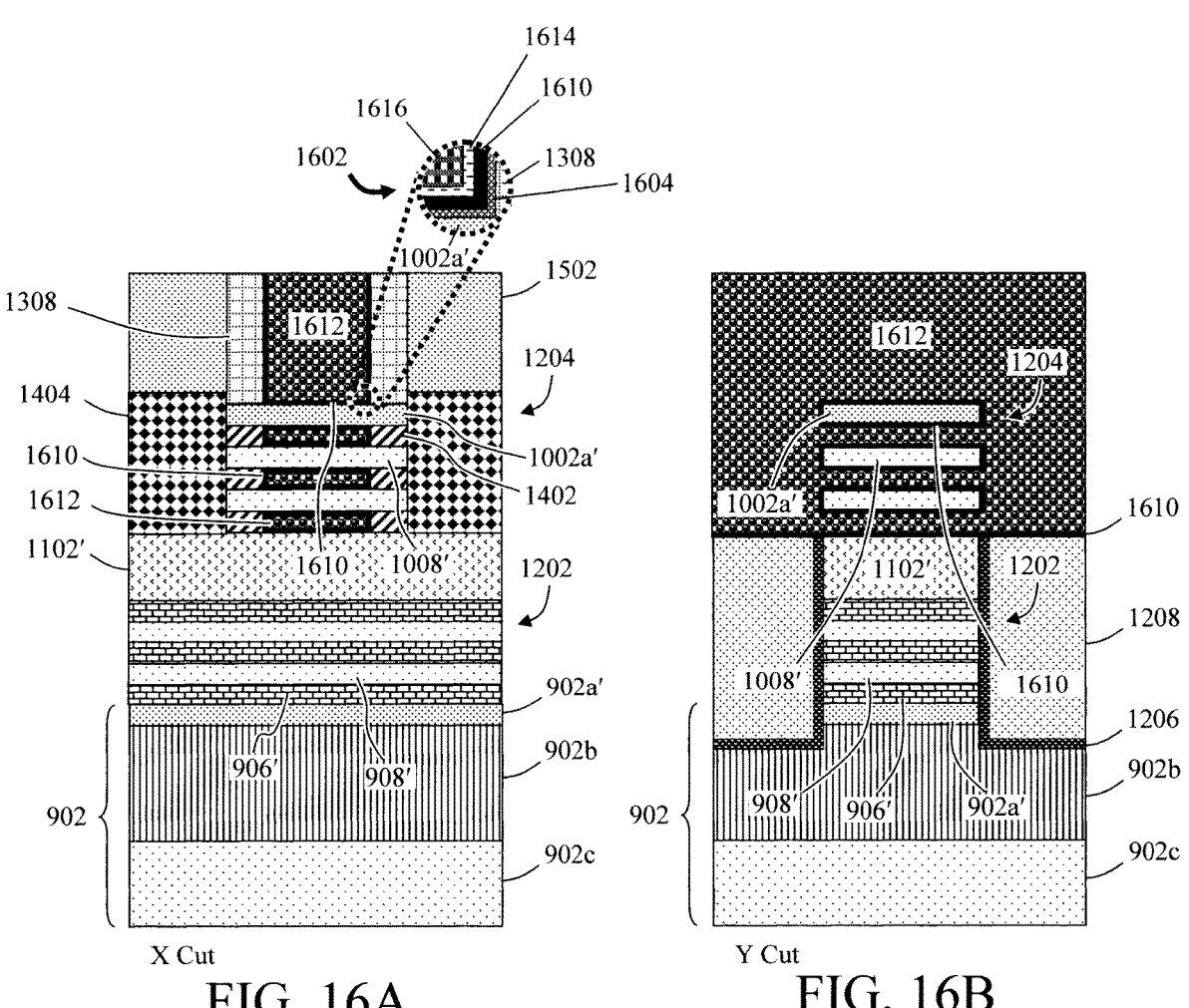
FIG. 16A is an X cross-sectional view and FIG. 16B is a Y cross-sectional view illustrating the sacrificial gate having been selectively removed from the second device stack followed by removal of the underlying sacrificial gate oxide, the patterned portions of the sacrificial layers having been removed from the second device stack, a gate dielectric having been deposited onto the patterned portions of the active layers in the second device stack, and a gate electrode having been deposited onto the gate dielectric according to an embodiment of the present invention.

As shown in FIG. 16A (an X cross-sectional view) and FIG. 16B (a Y cross-sectional view), the interlayer dielectric 1502 and dielectric spacers 1308 are recessed which removes the sacrificial gate hardmask 1304, the (now exposed) sacrificial gate 1306 is then selectively removed from the second device stack 1204 followed by removal of the underlying sacrificial gate oxide 1302, the patterned portions 1006' of the sacrificial layers are selectively removed from the second device stack 1204 relative to the patterned portions 1002a' of the SOI layer/patterned portions 1008' of the active layers, a gate dielectric 1610 is deposited onto the patterned portions 1002a' of the SOI layer/patterned portions 1008' of the active layers in the second device stack 1204, and a gate electrode 1612 is deposited onto the gate dielectric 1610 which surrounds the patterned portions 1002a' of the SOI layer/patterned portions 1008' of the active layers in a gate all around configuration.

As provided above, the sacrificial gate 1306 can be formed from poly-silicon and/or amorphous silicon. In that case, a poly-silicon and/or amorphous silicon-selective etch can be employed to remove the sacrificial gate 1306 from the second device stack 1204. An oxide-selective etching process may be employed to remove the sacrificial gate oxide 1302.

According to an exemplary embodiment, the patterned portions 1006' of the sacrificial layers are formed from SiGe, while the patterned portions 1002a' of the SOI layer/patterned portions 1008' of the active layers are formed from Si. In that case, etchants such as wet hot SC1, vapor phase HCl, vapor phase $ClF_3$ and/or other reactive clean processes can be employed to remove the patterned portions 1006' of the sacrificial layers selective to the patterned portions 1002a' of the SOI layer/patterned portions 1008' of the active layers. Removal of the patterned portions 1006' of the sacrificial layers releases the patterned portions 1002a' of the SOI layer/patterned portions 1008' of the active layers from the second device stack 1204. These 'released' patterned portions 1002a' of the SOI layer/patterned portions 1008' of the active layers will be used to form the channels of what will eventually be the bottom transistor.

Referring to magnified view 1602 in FIG. 16A, prior to depositing the gate dielectric 1610, an interfacial layer 1604 is preferably first formed on the patterned portions 1002a' of the SOI layer/patterned portions 1008' of the active layers. Use of an interfacial layer 1604 improves the channel/gate dielectric interface quality and channel carrier mobility. Suitable materials for the interfacial layer 1604 include but are not limited to oxide materials such as SiOx. According to an exemplary embodiment, the interfacial layer 1604 has a thickness of from about 0.5 nm to about 3 nm and ranges therebetween.

Interfacial layer 1604 and gate dielectric 1610 are part of what will eventually be the bottom transistor. According to an exemplary embodiment, the thickness and/or composition of the interfacial layer 1604 and/or the gate dielectric 1610 in the bottom transistor differs from the thickness and/or composition of the interfacial layer and/or the gate dielectric in the top transistor (see below). For instance, in the same manner as above, an optional dipole layer (not shown) can be deposited onto the interfacial layer 1604 prior to the gate dielectric 1610, and an anneal is performed (e.g., at a temperature of from about 500° C.' to about 1200° C., for a duration of from about 1 nanosecond to about 30 seconds, preferably in an inert gas such as nitrogen) following deposition of the gate dielectric 1610 to diffuse the metal or metals from the dipole layer into the interfacial layer 1604 and gate dielectric 1610. As such, following diffusion, the dipole layer would not be visible at this point in the process. Introducing a metal or metals such as La, Y, Mg and/or Ga via a dipole layer into the interfacial layer 1604 and gate dielectric 1610 can be used to tune the threshold voltage of the bottom transistor relative to the top transistor, or vice versa. As a result, the bottom and top transistors will have different threshold voltages from one another. Preferably, different dipole dopants are used in the interfacial layer/gate dielectric in the bottom transistor vis-à-vis the top transistor in order to achieve different threshold voltages.

Additionally, the interfacial layer 1604 and/or the gate dielectric 1610 in the bottom transistor can optionally receive different treatments (e.g., oxidation and nitridation) from the interfacial layer and/or the gate dielectric in the top transistor. Namely, as in the previous example, the bottom transistor is of a first polarity (e.g., either pFET or nFET), while the top transistor is of a second/opposite polarity (either an nFET if the bottom transistor is a pFET or a pFET if the bottom transistor is an nFET). As such, the treatment performed on the interfacial layer 1604 and/or the gate dielectric 1610 can depend on whether the bottom transistor and the top transistor are a pFET and an nFET, or vice versa. For example, as will be described in detail below, nitridation is preferably performed only for the nFET interfacial layer and/or the gate dielectric, while the pFET interfacial layer and/or gate dielectric remains nitrogen-free.

Furthermore, even if the same material (e.g., $HfO_2$) is used as the gate dielectric 1610 in the bottom transistor and as the gate dielectric in the top transistor, embodiments are contemplated herein where the gate dielectric used in the nFET transistor is thicker than the gate dielectric used in the pFET transistor. For example, as will be described in detail below, the thickness of the nFET gate dielectric is preferably from about 1 Å to about 2 Å greater than the thickness of the pFET gate dielectric.

In one exemplary embodiment, the gate dielectric 1610 is a high-κ material. Suitable high-κ gate dielectrics include, but are not limited to, $HfO_2$, $La_2O_3$. $HfLaO_2$. $HfZrO_2$ and/or $HfAlO_2$. A process such as CVD. ALD or PVD can be employed to deposit the gate dielectric 1610. According to an exemplary embodiment, gate dielectric 1610 has a thickness of from about 1 nm to about 5 nm and ranges therebetween.

As also shown in magnified view 1602, the gate electrode 1612 includes at least one workfunction-setting metal 1614 disposed on the gate dielectric 1610, and an optional (low-resistance) fill metal 1616 disposed on the workfunction-setting metal(s) 1614. As highlighted above, the bottom transistor is a transistor of a first polarity (pFET or nFET) and the top transistor (see below) is a transistor of a second, opposite polarity (i.e., an nFET when the first/bottom transistor is a pFET or a pFET when the first/bottom transistor is an nFET). Thus, workfunction-setting metal(s) 1614 is/are either p-type or n-type workfunction-setting metals depending on whether the respective transistor (in this case the bottom transistor) is a pFET or an nFET, respectively. Suitable (n-type) workfunction-setting metals include, but are not limited to, TiN. TaN and/or Al-containing alloys such as TiAl, TiAlN, TiAlC, TaAl, TaAlN, and/or TaAlC, and/or Ti-containing alloys such as TiC and/or TaTi. Suitable (p-type) workfunction-setting metals include, but are not limited to, TiN, TaN, and/or W. TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above. It is notable, however, that this is not an exhaustive list and that these workfunction-setting metals are not meant to be exclusive to transistors of one polarity, e.g., TiAlC can be implemented as a workfunction-setting metal in both nFET and pFET transistors. A process such as CVD, ALD or PVD can be employed to deposit the workfunction-setting metal(s) 1614. As will be described in detail below, the thickness and/or composition of the workfunction-setting metal(s) 1614 in the bottom transistor can differ from the thickness and/or composition of the workfunction-setting metal(s) in the top transistor (see below).

Suitable low-resistance fill metals 1616 include, but are not limited to, W, Co, Ru and/or Al. The low-resistance fill metals 1616 can be deposited using a process or combination of processes including, but not limited to, CVD, ALD, PVD, sputtering, plating, evaporation, ion beam deposition, electron beam deposition, laser assisted deposition, chemical solution deposition, etc.

As such, according to the above-described exemplary embodiment, the replacement metal gate of what will eventually be the bottom transistor includes interfacial layer 1604 disposed on the patterned portions 1002a' of the SOI layer/patterned portions 1008' of the active layers in the second device stack 1204, the gate dielectric 1610 surrounding the patterned portions 1002a' of the SOI layer/patterned portions 1008' of the active layers over the interfacial layer 1604, and the gate electrode 1612 disposed on the gate dielectric 1610 which surrounds the patterned portions 1002a' of the SOI layer/patterned portions 1008' of the active layers in the second device stack 1204 in a gate all around configuration. The gate electrode 1612 includes the at least one of workfunction-setting metal(s) 1614 disposed on the gate dielectric 1610, and the optional (low-resistance) fill metal 1616 disposed on the workfunction-setting metal(s) 1614.

Figures 17A, 17B:
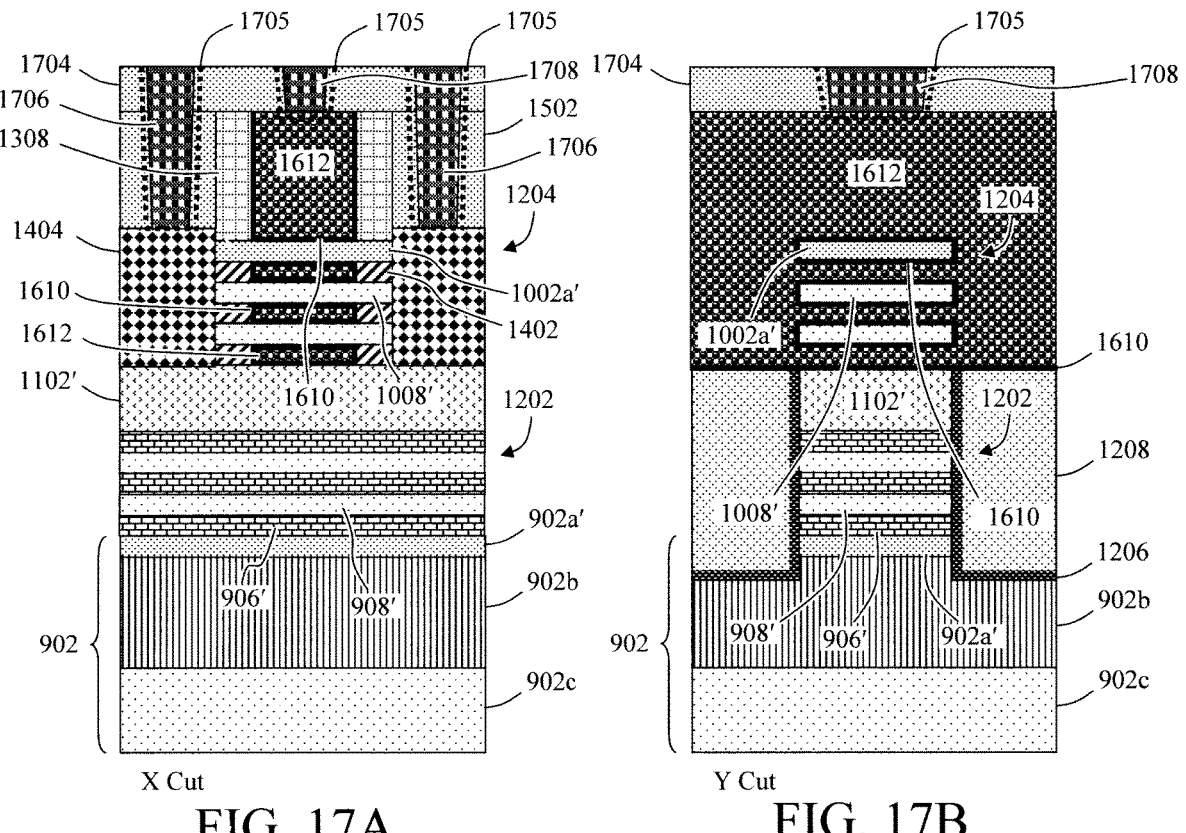
FIG. 17A is an X cross-sectional view and FIG. 17B is a Y cross-sectional view illustrating interconnects having been formed to the source/drain regions and the gate electrode according to an embodiment of the present invention.

As shown in FIG. 17A (an X cross-sectional view) and FIG. 17B (a Y cross-sectional view), interconnects 1706 and 1708 are then formed to the source/drain regions 1404 and the gate electrode 1612, respectively. In order to form the interconnects 1706 and 1708, an interlayer dielectric 1704 is first deposited over the dielectric spacers 1308 and gate electrode 1612. Suitable interlayer dielectric 1704 materials include, but are not limited to, SiN, SiOC and/or oxide low-κ materials such as SiOx and/or ULK-ILD materials such as pSiCOH, which can be deposited using a process such as CVD, ALD or PVD. Following deposition, the interlayer dielectric 1704 can be polished using a process such as chemical mechanical polishing.

Interconnects 1706 and 1708 are then formed in the interlayer dielectric 1704. To do so, standard lithography and etching techniques (see above) are employed to pattern features 1705 (e.g., trenches and/or vias) in the interlayer dielectric 1704. The features 1705 are then filled with a contact metal(s) to form the interconnects 1706 and 1708. As provided above, suitable contact metals include, but are not limited to, Cu, Ni. Pt, Ru. Co and/or W, which can be deposited using a process such as evaporation, sputtering, or electrochemical plating. Following deposition, the metal overburden can be removed using a process such as chemical-mechanical polishing.

Prior to depositing the contact metal(s) into the features 1705, a conformal barrier layer (not shown) can be deposited into and lining the features 1705. Use of such a barrier layer helps to prevent diffusion of the contact metal(s) into the surrounding interlayer dielectric 1704. As provide above, suitable barrier layer materials include, but are not limited to, Ru, Ta, TaN, Ti, and/or TiN. Additionally, a seed layer (not shown) can be deposited into and lining the features 1705 prior to deposition of the contact metal(s). A seed layer facilitates plating of the contact metal(s) into the features 1705.

As shown in FIGS. 17A-B, at this stage in the process, what will eventually be the bottom transistor includes the dielectric spacers 1308/inner spacers 1402 above/between the patterned portion 1002a' of the SOI layer/patterned portions 1008' of the active layers, the source/drain regions 1404 interconnected by the patterned portion 1002a' of the SOI layer/patterned portions 1008' of the active layers, the interlayer dielectrics 1502 and 1704 disposed on the source/drain regions 1404, the gate dielectric 1610 disposed on the patterned portion 1002a' of the SOI layer/patterned portions 1008' of the active layers and along the sidewalls of the dielectric spacers 1308 and inner spacers 1402, and the gate electrode 1612 disposed on the gate dielectric 1610 surrounding the patterned portion 1002a' of the SOI layer/patterned portions 1008' of the active layers in a gate all around configuration.

Figures 18A, 18B:
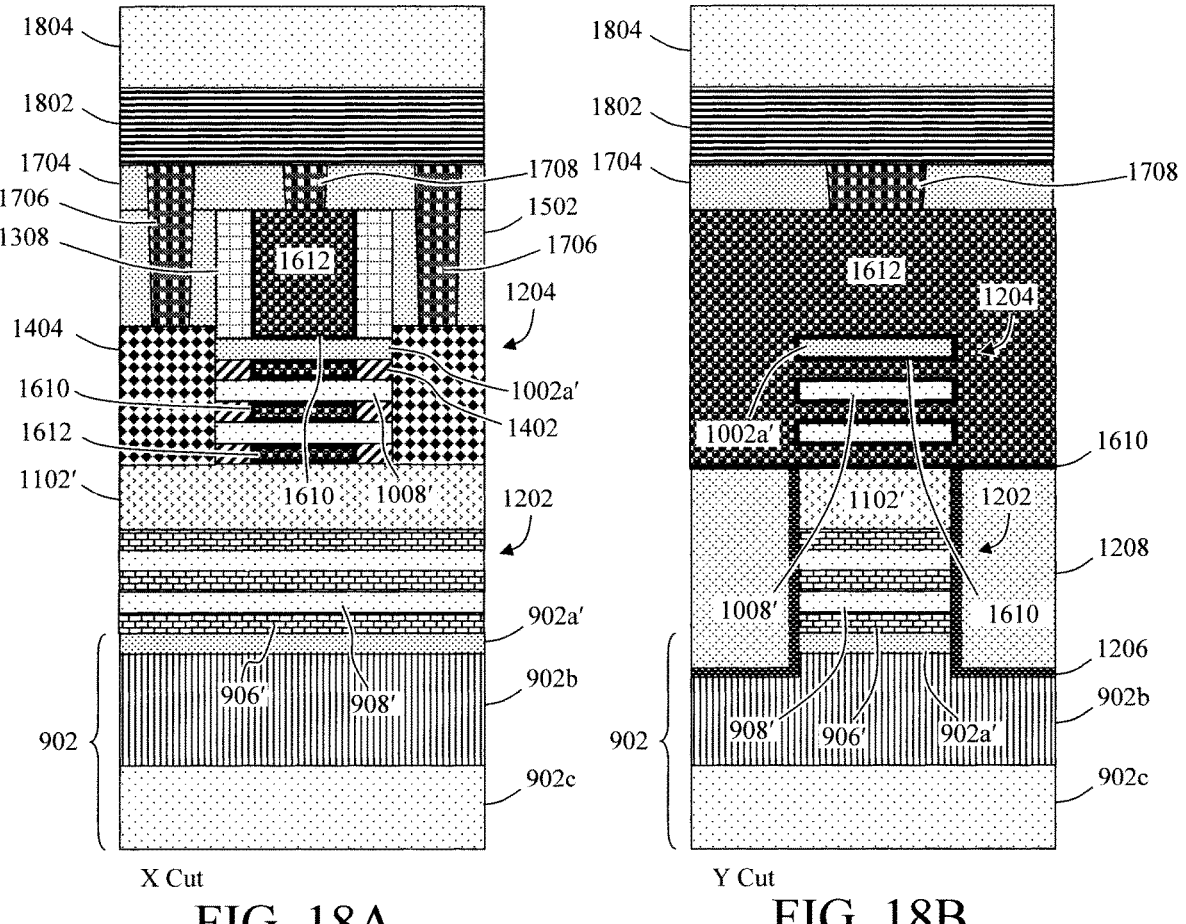
FIG. 18A is an X cross-sectional view and FIG. 18B is a Y cross-sectional view illustrating a back end of line interconnect layer having been formed over the interconnects, and a carrier wafer having been bonded to the back end of line interconnect layer according to an embodiment of the present invention.

As shown in FIG. 18A (an X cross-sectional view) and FIG. 18B (a Y cross-sectional view), a back end of line interconnect layer 1802 is formed over the interconnects 1706 and 1708, and a carrier wafer 1804 is bonded to the back end of line interconnect layer 1802. Namely, as will be described in detail below, carrier wafer 1804 will enable the stacked FET structure to be flipped over for processing of the first device stack 1202 in order to form the top transistor.

Back end of line interconnect layer 1802 generally includes interconnect structures commonly formed in the back end of line during semiconductor device fabrication. Namely, in the back end of line, individual devices such as transistors get interconnected through a series of metal layers. For instance, conductive structures like vias and metal lines can be employed to connect a device to one or more other devices, with the metal lines making lateral connections and the vias making vertical connections amongst different metallization levels. Standard metallization techniques can be employed to form the back end of line interconnect layer 1802. While the individual interconnects present in back end of line interconnect layer 1802 are not specifically shown in the figures, one skilled in the art would understand how such a back end of line interconnect layer 1802 is implemented for a given semiconductor device application.

Carrier wafer 1804 is then bonded to the stacked FET structure over back end of line interconnect layer 1802.

Suitable carrier wafers include, but are not limited to, silicon, silicon carbide and/or glass wafers.

Figures 19A, 19B:
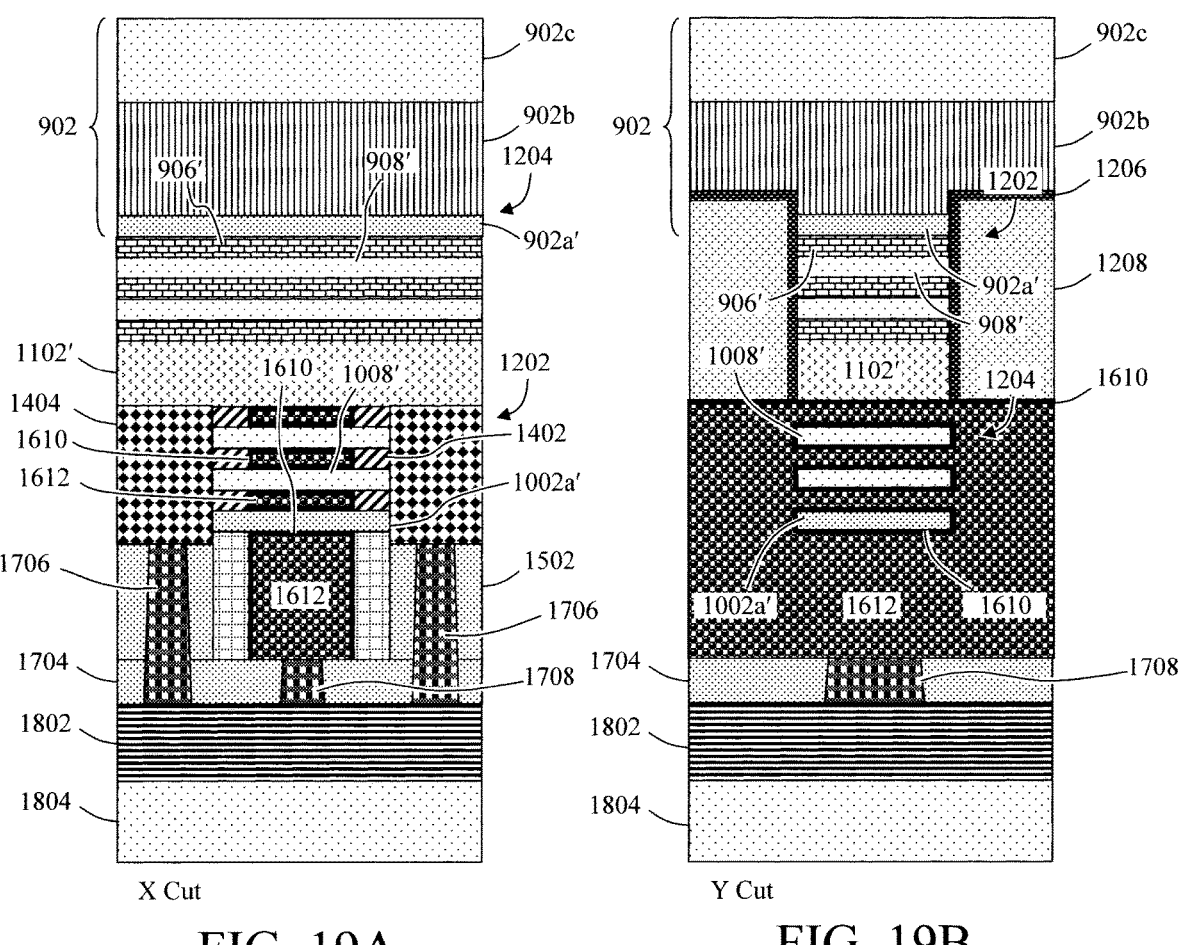
FIG. 19A is an X cross-sectional view and FIG. 19B is a Y cross-sectional view illustrating the stacked structure having been flipped over according to an embodiment of the present invention.

As shown in FIG. 19A (an X cross-sectional view) and FIG. 19B (a Y cross-sectional view), the stacked FET structure is then flipped over. Namely, as shown in FIGS. 19A-B, components once at the bottom of the structure are now at the top, and vice versa. For instance, the carrier wafer 1804 which was the top-most component in FIGS. 18A-B is now at the bottom of the stacked FET structure. Conversely, the substrate 902c which was the bottom-most component in FIGS. 18A-B is now at the top of the stacked FET structure. Further, the final orientation of the bottom and top transistors is now evident. Namely, the transistor formed from the second device stack 1204 as described above is now at the bottom, and will remain the bottom transistor in the final stacked FET design. Conversely, the transistor that will be formed from the first device stack 1202 (see below) will be at the top, and will remain the top transistor in the final stacked FET design.

Figures 20A, 20B:
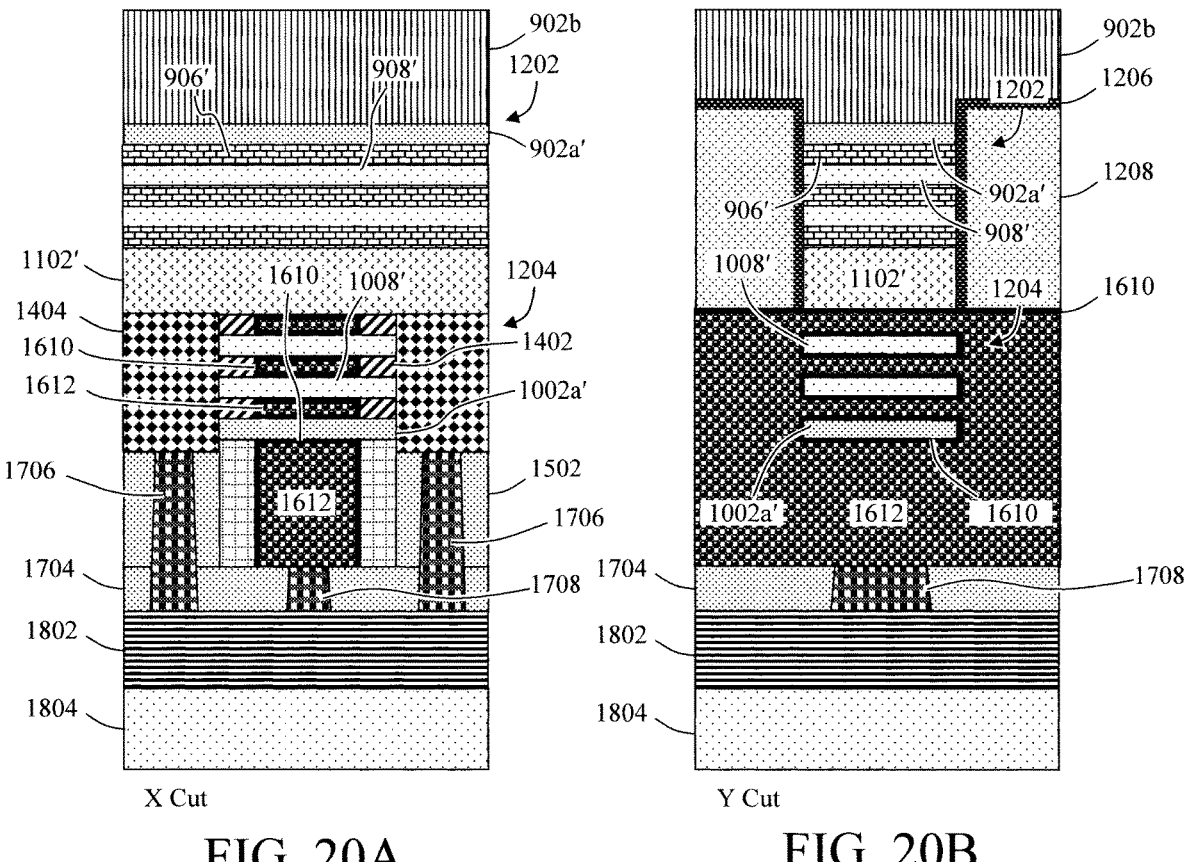
FIG. 20A is an X cross-sectional view and FIG. 20B is a Y cross-sectional view illustrating an etch having been used to remove the substrate from the first device stack according to an embodiment of the present invention.

As shown in FIG. 20A (an X cross-sectional view) and FIG. 20B (a Y cross-sectional view), an etch is used to remove the substrate 902c from the first device stack 1202. The buried (e.g., oxide) insulator 902b acts as an etch stop for the substrate 902c removal.

Figures 21A, 21B:
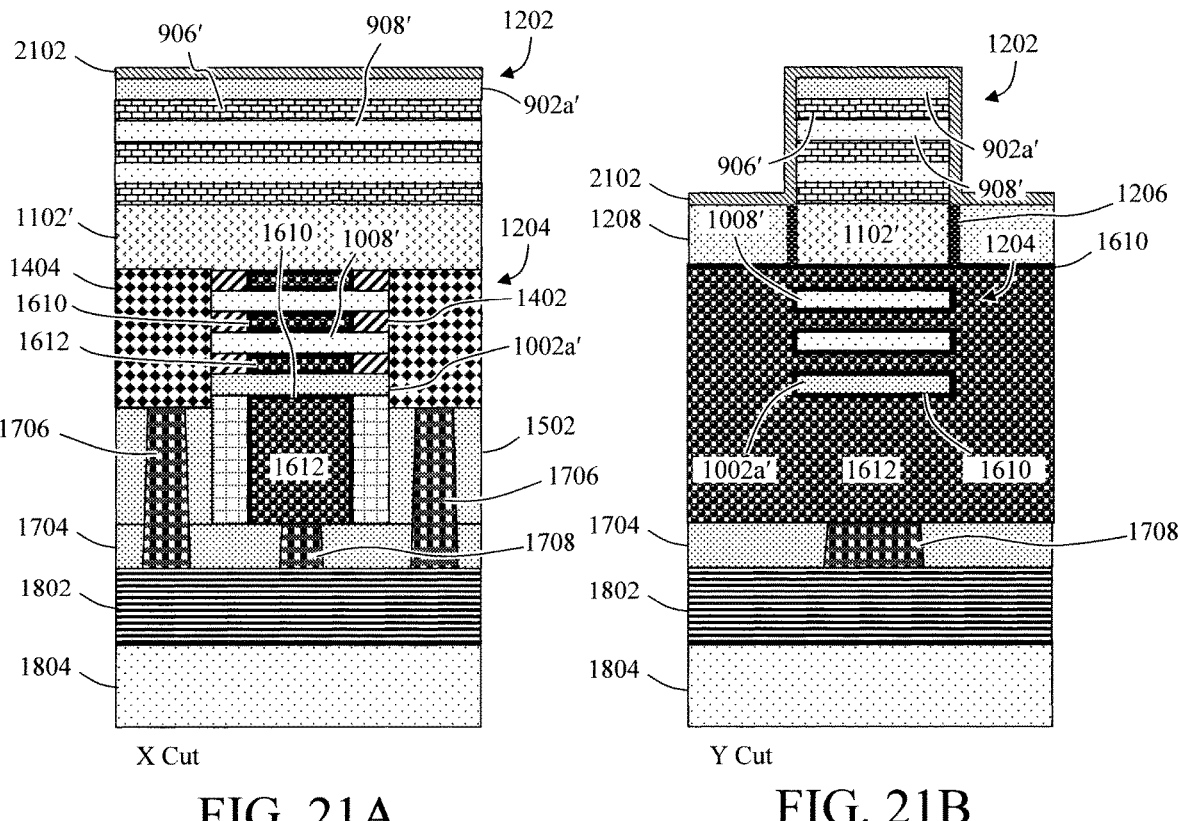
FIG. 21A is an X cross-sectional view and FIG. 21B is a Y cross-sectional view illustrating the underlying buried insulator having been removed, the liner and shallow trench isolation regions having been recessed to reveal the first device stack, and a sacrificial gate oxide having been formed over the first device stack according to an embodiment of the present invention.

As shown in FIG. 21A (an X cross-sectional view) and FIG. 21B (a Y cross-sectional view), the buried insulator 902b is removed, the liner 1206 and shallow trench isolation regions 1208 are recessed to reveal the first device stack 1202, and a sacrificial gate oxide 2102 is formed on the (recessed) shallow trench isolation regions 1208 and over the first device stack 1202. As provided above, the buried insulator 902b, the liner 1206 and the shallow trench isolation regions 1208 can all be formed from an oxide material. In that case, an oxide-selective etch can be used to remove the buried insulator 902b with an overetch to recess the liner 1206 and shallow trench isolation regions 1208.

According to an exemplary embodiment, the sacrificial gate oxide 2102 is formed on the first device stack 1202 having a thickness of from about 1 nm to about 3 nm. Suitable materials for the sacrificial gate oxide 2102 include, but are not limited to, SiOx. For clarity, the terms 'first' and 'second' may also be used herein when referring to sacrificial gate oxide 2102 and sacrificial gate oxide 1302, respectively.

Figures 22A, 22B:
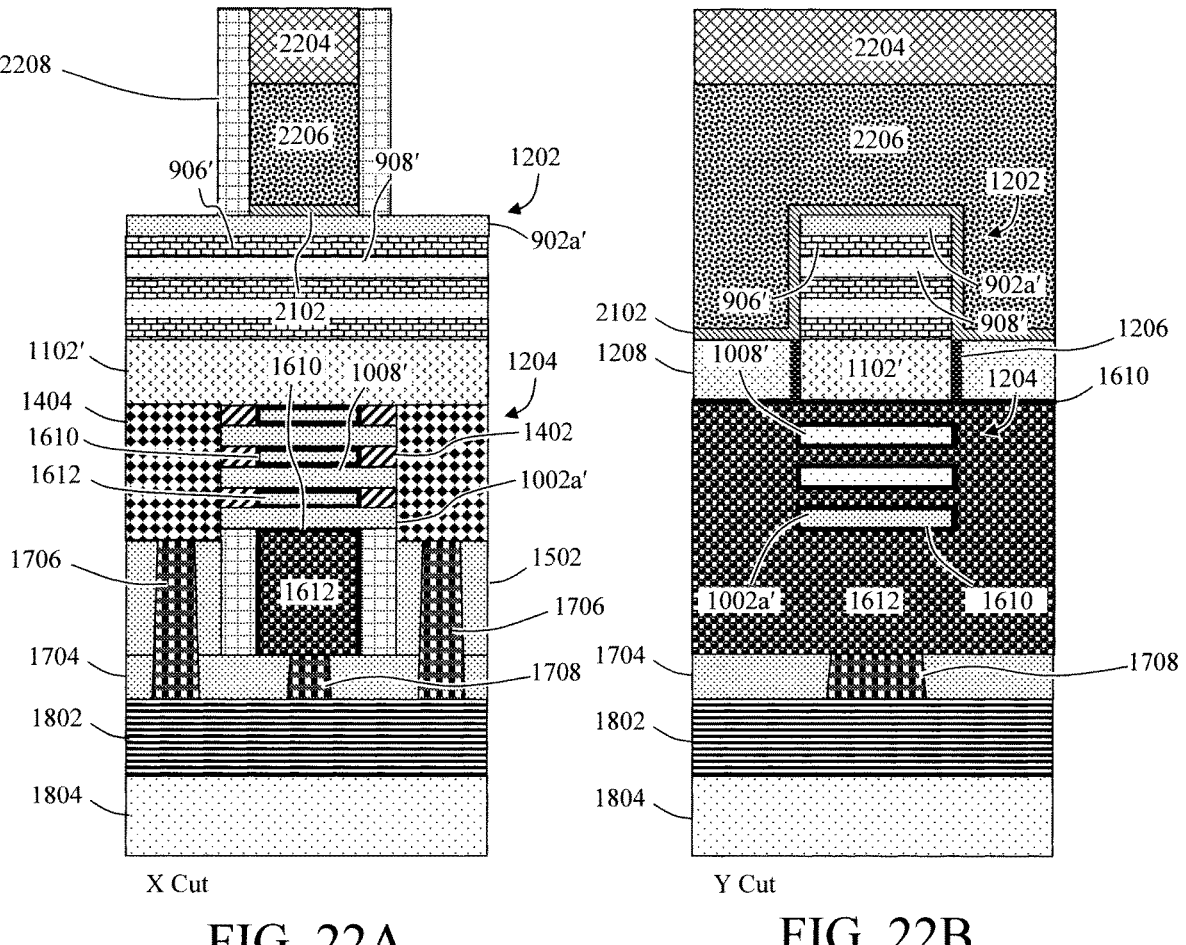
FIG. 22A is an X cross-sectional view and FIG. 22B is a Y cross-sectional view illustrating a sacrificial gate having been formed on the first device stack over the sacrificial gate oxide using a sacrificial gate hardmask, and dielectric spacers having been formed alongside the sacrificial gate hardmask and sacrificial gate according to an embodiment of the present invention.

As shown in FIG. 22A (an X cross-sectional view) and FIG. 22B (a Y cross-sectional view), a sacrificial gate 2206 is formed on the first device stack 1202 over the sacrificial gate oxide 2102 using a sacrificial gate hardmask 2204, and dielectric spacers 2208 are formed alongside the sacrificial gate hardmask 2204 and sacrificial gate 2206. For clarity, the terms 'first' and 'second' may also be used herein when referring to sacrificial gate hardmask 2204/sacrificial gate 2206/dielectric spacers 2208 and sacrificial gate hardmask 1304/sacrificial gate 1306/dielectric spacers 1308, respectively. The sacrificial gate 2206 (e.g., poly-silicon and/or amorphous silicon) is formed using sacrificial gate hardmask 2204 (e.g., SiN, SiO2, TiN and/or SiON) in the same manner as described in conjunction with the formation of sacrificial gate 1306 using sacrificial gate hardmask 1304 above. Similarly, dielectric spacers 2208 (e.g., SiOx, SiC, SiCO, SiN, SiBCN and/or SiOCN) are formed in the same manner as described in conjunction with the formation of dielectric spacers 1308 above.

Figures 23A, 23B:
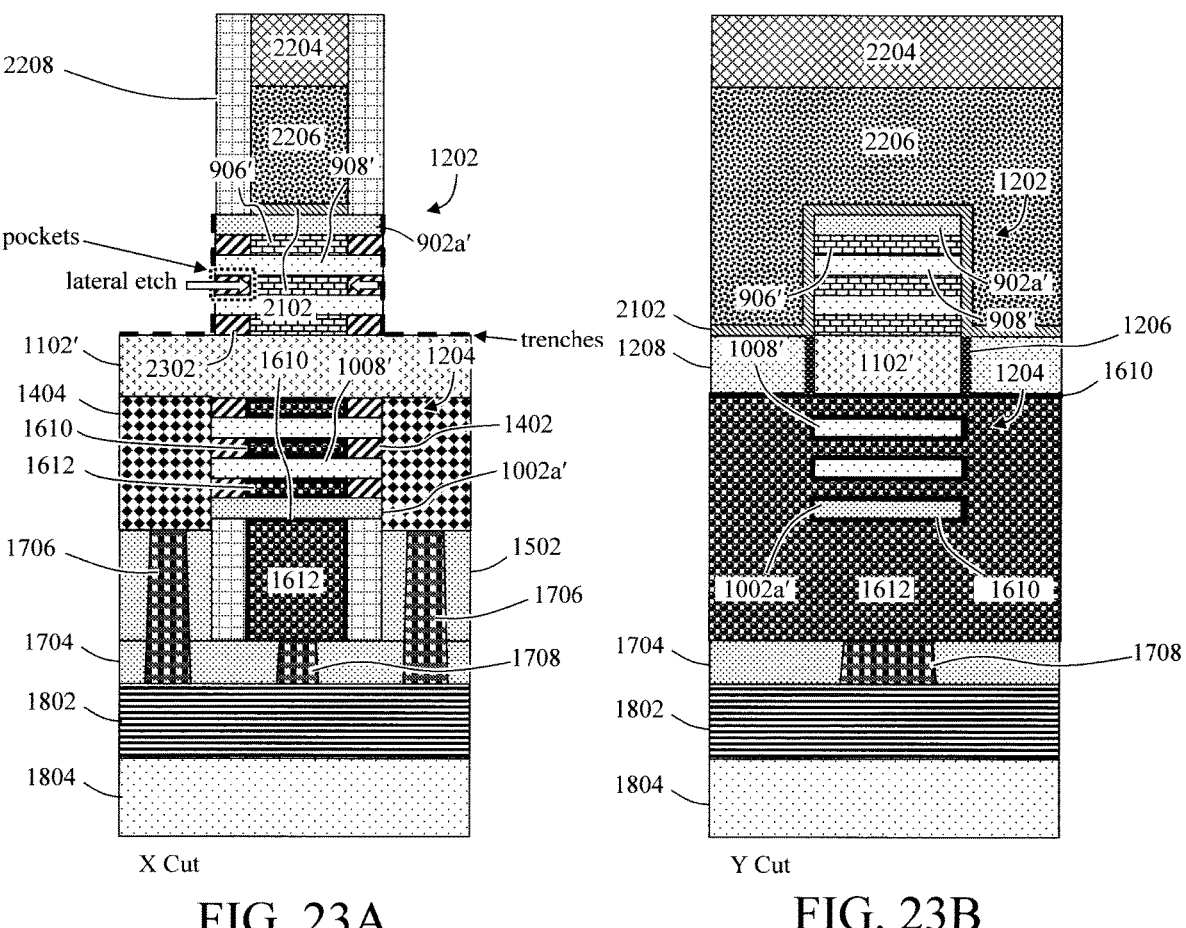
FIG. 23A is an X cross-sectional view and FIG. 23B is a Y cross-sectional view illustrating trenches having been patterned in the first device stack, and inner spacers having been formed alongside patterned portions of the sacrificial layers in the first device stack according to an embodiment of the present invention.

As shown in FIG. 23A (an X cross-sectional view) and FIG. 23B (a Y cross-sectional view), the sacrificial gate hardmask 2204/sacrificial gate 2206/dielectric spacers 2208 are used as a mask to pattern trenches (outlined with dashed lines) in the first device stack 1202, and inner spacers 2302 are formed alongside the patterned portions 906' of the sacrificial layers in the trenches.

To form the inner spacers 2302, a selective lateral etch is performed to first recess the patterned portions 906' of the sacrificial layers in the trenches. This recess etch forms pockets along the sidewalls of the first device stack 1202 that are then filled with a dielectric spacer material to form the inner spacers 2302 within the pockets. The inner spacers 2302 will serve to offset the replacement metal gates from the source/drain regions (see below). As provided above, the patterned portions 906' of the sacrificial layers can be formed from SiGe. In that case, a SiGe-selective non-directional (isotropic) etching process can be used for the recess etch. Suitable dielectric spacer materials for inner spacers 2302 include, but are not limited to, SiN. SiOx, SiC and/or SiCO. A process such as CVD, ALD or PVD can be employed to deposit the dielectric spacer material into the pockets, after which excess spacer material can be removed using an isotropic etching process such as reactive ion etching.

Figures 24A, 24B:
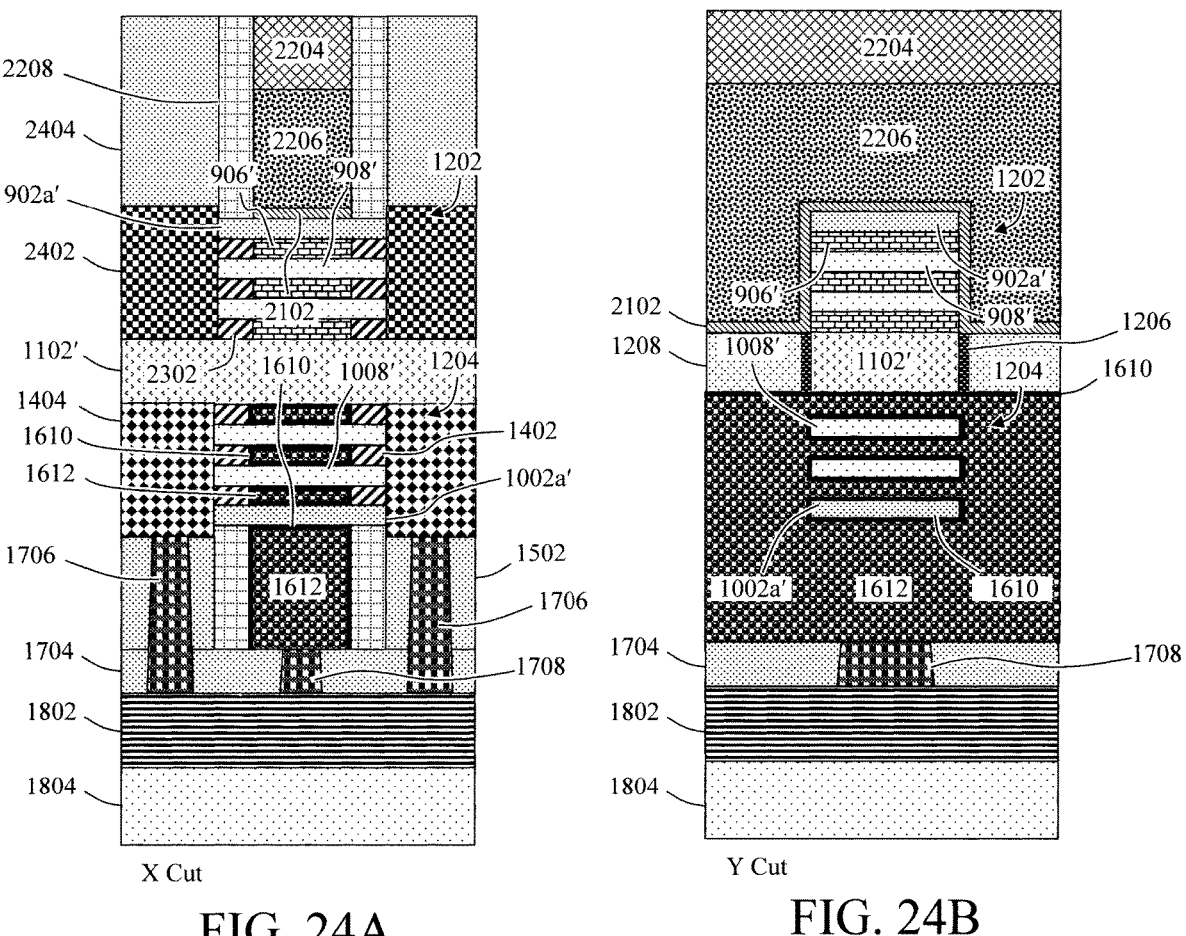
FIG. 24A is an X cross-sectional view and FIG. 24B is a Y cross-sectional view illustrating source/drain regions having been formed in the trenches, and an interlayer dielectric having been deposited over the source/drain regions according to an embodiment of the present invention.

As shown in FIG. 24A (an X cross-sectional view) and FIG. 24B (a Y cross-sectional view), source/drain regions 2402 are formed in the trenches on opposite sides of the sacrificial gate 2206 alongside the patterned portions 906' of the sacrificial layers and patterned portions 902a'/908' of the SOI layer/active layers, and an interlayer dielectric 2404 is deposited over the source/drain regions 2402. For clarity, the terms 'first' and 'second' may also be used herein when referring to source/drain regions 2402 and source/drain regions 1404, respectively.

According to an exemplary embodiment, the source/drain regions 2402 are formed from an in-situ doped (i.e., during growth) or ex-situ doped (e.g., via ion implantation) epi-taxial material such as epitaxial Si, epitaxial SiGe, etc. Suitable p-type dopants include, but are not limited to, boron (B). Suitable n-type dopants include, but are not limited to, phosphorous (P) and/or arsenic (As). With inner spacers 2302 in place along the sidewalls of the first device stack 1202, epitaxial growth of the source/drain regions 2402 is templated only from the ends of the patterned portions 906' of the sacrificial layers and patterned portions 902a'/908' of the SOI layer/active layers along the sidewalls of the first device stack 1202.

Suitable interlayer dielectric 2404 materials include, but are not limited to. SiN. SiOC and/or oxide low-κ materials such as SiOx and/or oxide ULK-ILD materials such as pSiCOH, which can be deposited using a process such as CVD. ALD or PVD. Following deposition, the interlayer dielectric 2404 can be planarized using a process such as chemical mechanical polishing.

Figures 25A, 25B:
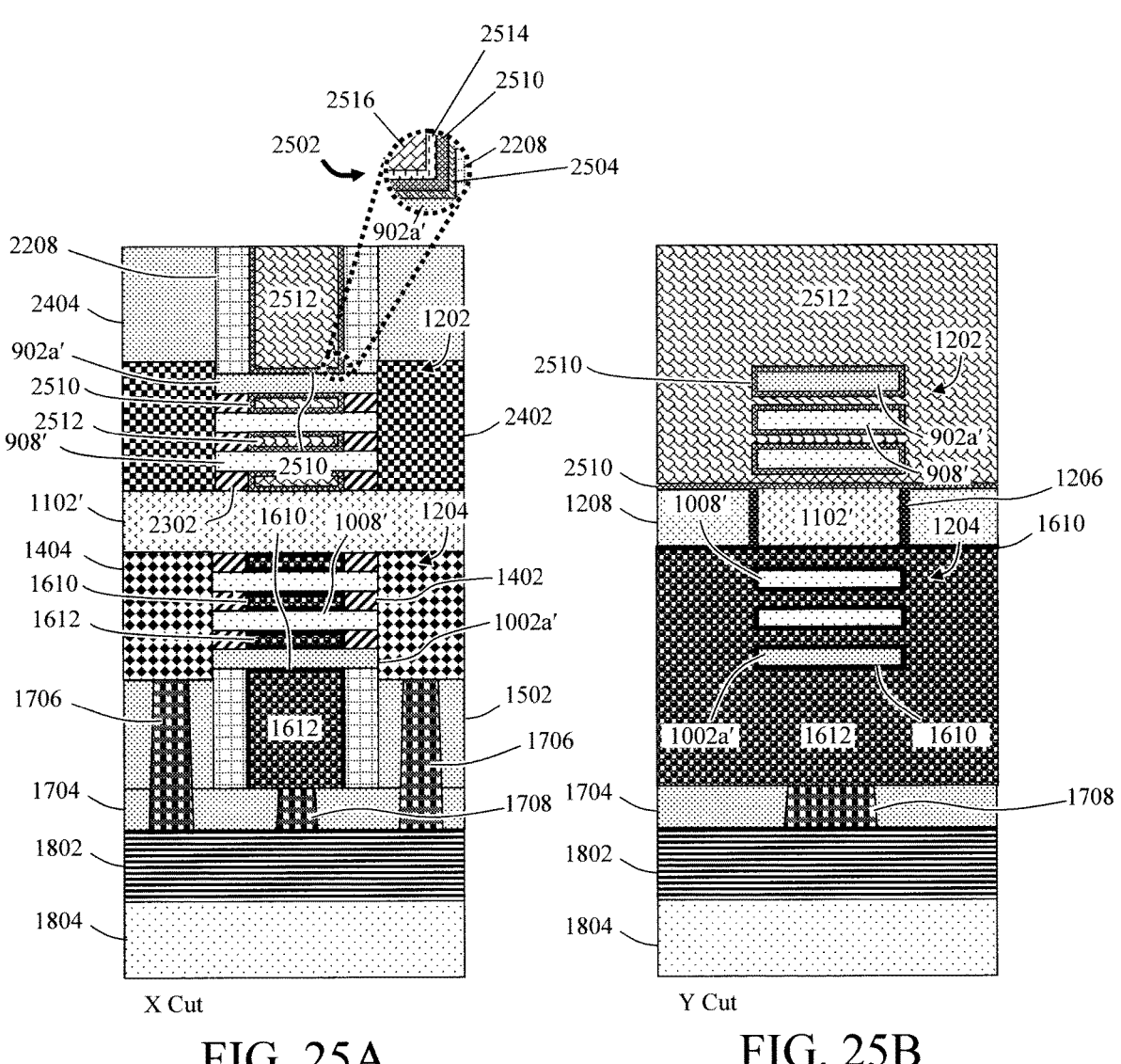
FIG. 25A is an X cross-sectional view and FIG. 25B is a Y cross-sectional view illustrating the sacrificial gate having been selectively removed from the first device stack followed by removal of the underlying sacrificial gate oxide, the patterned portions of the sacrificial layers having been removed from the first device stack, a gate dielectric having been deposited onto the patterned portions of the active layers in the first device stack, and a gate electrode having been deposited onto the gate dielectric according to an embodiment of the present invention.

As shown in FIG. 25A (an X cross-sectional view) and FIG. 25B (a Y cross-sectional view), the interlayer dielectric 2404 and dielectric spacers 2208 are recessed which removes the sacrificial gate hardmask 2204, the (now exposed) sacrificial gate 2206 is then selectively removed from the first device stack 1202 followed by removal of the underlying sacrificial gate oxide 2102, the patterned portions 906' of the sacrificial layers are selectively removed from the first device stack 1202 relative to the patterned portions 902a' of the SOI layer/patterned portions 908' of the active layers, a gate dielectric 2510 is deposited onto the patterned portions 902a' of the SOI layer/patterned portions 908' of the active layers in the first device stack 1202, and deposition of a gate electrode 2512 is deposited onto the gate dielectric 2510 which surrounds the patterned portions 902a' of the SOI layer/patterned portions 908' of the active layers in a gate all around configuration.

As provided above, the sacrificial gate 2206 can be formed from poly-silicon and/or amorphous silicon. In that case, a poly-silicon and/or amorphous silicon-selective etch can be employed to remove the sacrificial gate 2206 from the first device stack 1202. An oxide-selective etching process may be employed to remove the sacrificial gate oxide 2102.

According to an exemplary embodiment, the patterned portions 906' of the sacrificial layers are formed from SiGe, while the patterned portions 902a' of the SOI layer/patterned portions 908' of the active layers are formed from Si. In that case, etchants such as wet hot SC1, vapor phase HCl, vapor phase ClF$_3$ and/or other reactive clean processes can be employed to remove the patterned portions 906' of the sacrificial layers selective to the patterned portions 902a' of the SOI layer/patterned portions 908' of the active layers. Removal of the patterned portions 906' of the sacrificial layers releases the patterned portions 902a' of the SOI layer/patterned portions 908' of the active layers from the first device stack 1202. These 'released' patterned portions 902a' of the SOI layer/patterned portions 908' of the active layers will be used to form the channels of the top transistor.

Referring to magnified view 2502 in FIG. 25A, prior to depositing the gate dielectric 2510, an interfacial layer 2504 is preferably first formed on the patterned portions 902a' of the SOI layer/patterned portions 908' of the active layers. For clarity, the terms 'first' and 'second' may also be used herein when referring to interfacial layer 2504/gate dielectric 2510 and interfacial layer 1604/gate dielectric 1610, respectively. Use of an interfacial layer 2504 improves the channel/gate dielectric interface quality and channel carrier mobility. Suitable materials for the interfacial layer 2504 include but are not limited to oxide materials such as SiOx. According to an exemplary embodiment, the interfacial layer 2504 has a thickness of from about 0.5 nm to about 3 nm and ranges therebetween.

Interfacial layer 2504 and gate dielectric 2510 are part of the top transistor. According to an exemplary embodiment, the thickness and/or composition of the interfacial layer 2504 and/or the gate dielectric 2510 in the top transistor differs from the thickness and/or composition of the interfacial layer 1604 and/or the gate dielectric 1610 in the bottom transistor. For instance, in the same manner as above, an optional dipole layer (not shown) can be deposited onto the interfacial layer 2504 prior to the gate dielectric 2510, followed by an anneal (e.g., at a temperature of from about 500° C. to about 1200° C., for a duration of from about 1 nanosecond to about 30 seconds, preferably in an inert gas such as nitrogen) to diffuse the metal or metals from the dipole layer into the interfacial layer 2504 and gate dielectric 2510. As such, following diffusion, the dipole layer would not be visible at this point in the process. Introducing a metal or metals such as La, Y, Mg and/or Ga via a dipole layer into the interfacial layer 2504 and gate dielectric 2510 can be used to tune the threshold voltage of the top transistor relative to the bottom transistor, or vice versa. As a result, the top and bottom transistors will have different threshold voltages from one another. Preferably, different dipole dopants are used in the interfacial layer/gate dielectric in the top transistor vis-à-vis the bottom transistor in order to achieve different threshold voltages.

Additionally, the interfacial layer 2504 and/or the gate dielectric 2510 in the top transistor can optionally receive different treatments (e.g., oxidation and nitridation) from the interfacial layer and/or the gate dielectric in the bottom transistor. Namely, as in the previous example, the bottom transistor is of a first polarity (e.g., either pFET or nFET), while the top transistor is of a second/opposite polarity (either an nFET if the bottom transistor is a pFET or a pFET if the bottom transistor is an nFET). As such, the treatment performed on the interfacial layer 2504 and/or the gate dielectric 2510 can depend on whether the top transistor and the bottom transistor are an nFET and a pFET, or vice versa.

For example, if the top transistor and the bottom transistor are a pFET and an nFET, respectively, then the interfacial layer 2504 and/or the gate dielectric 2510 in the top transistor (in this case a pFET) might receive an oxidation treatment, whereas the interfacial layer 1604 and/or the gate dielectric 1610 in the bottom transistor (in this case an nFET) would receive a nitridation treatment. As a result, the interfacial layer 1604 and/or the gate dielectric 1610 in the bottom transistor would contain nitrogen (e.g., nitrogen-doped HfO$_2$), whereas the interfacial layer 2504 and/or the gate dielectric 2510 in the top transistor would be nitrogen free. Conversely, if the top transistor and the bottom transistor are an nFET and a pFET, respectively, then the interfacial layer 2504 and/or the gate dielectric 2510 in the top transistor (in this case an nFET) might receive a nitridation treatment, whereas the interfacial layer 1604 and/or the gate dielectric 1610 in the bottom transistor (in this case a pFET) would receive an oxidation treatment. As a result, the interfacial layer 1604 and/or the gate dielectric 1610 in the bottom transistor would be nitrogen free, whereas the interfacial layer 2504 and/or the gate dielectric 2510 in the top transistor contain nitrogen (e.g., nitrogen-doped HfO$_2$).

Furthermore, even if the same material (e.g., HfO$_2$) is used as the gate dielectric 2510 in the top transistor and as the gate dielectric 1610 in the bottom transistor, embodiments are contemplated herein where the gate dielectric used in the nFET transistor is thicker than the gate dielectric used in the pFET transistor. For example, as will be described in detail below, the thickness of the nFET gate dielectric is preferably from about 1 Å to about 2 Å greater than the thickness of the pFET gate dielectric.

In one exemplary embodiment, the gate dielectric 2510 is a high-K material. Suitable high-κ gate dielectrics include, but are not limited to, HfO$_2$, La$_2$O$_3$, HfLaO$_2$, HfZrO$_2$ and/or HfAlO$_2$. A process such as CVD, ALD or PVD can be employed to deposit the gate dielectric 2510. According to an exemplary embodiment, gate dielectric 2510 has a thickness of from about 1 nm to about 5 nm and ranges therebetween.

As also shown in magnified view 2502, the gate electrode 2512 includes at least one workfunction-setting metal 2514 disposed on the gate dielectric 2510, and an optional (low-resistance) fill metal 2516 disposed on the workfunction-setting metal(s) 2514. For clarity, the terms 'first' and 'second' may also be used herein when referring to workfunction-setting metal 2514/(low-resistance) fill metal 2516 and workfunction-setting metal 1614/(low-resistance) fill metal 1616, respectively. Suitable n-type and p-type workfunction-setting metals and suitable fill metals were provided above.

According to an exemplary embodiment, the thickness and/or composition of the workfunction-setting metal(s) 2514 in the top transistor differ from the thickness and/or composition of the workfunction-setting metal(s) 1614 in the bottom transistor. For instance, to use an illustrative, non-limiting example, both the workfunction-setting metal(s) 2514 in the top transistor and the workfunction-setting metal(s) 1614 in the bottom transistor can include TiAlC. However, the thickness of the TiAlC in the pFET is preferably less than the thickness of the TiAlC in the nFET.

Further, when used as the pFET workfunction-setting metal, the concentration of Al in the TiAlC is preferably lower than when it is used as nFET workfunction-setting metal.

Suitable low-resistance fill metals 2516 include, but are not limited to, W, Co, Ru and/or Al. The low-resistance fill metals 2516 can be deposited using a process or combination of processes including, but not limited to, CVD, ALD, PVD, sputtering, plating, evaporation, ion beam deposition, electron beam deposition, laser assisted deposition, chemical solution deposition, etc.

As such, according to the above-described exemplary embodiment, the replacement metal gate of the top transistor includes interfacial layer 2504 disposed on the patterned portions 902a' of the SOI layer/patterned portions 908' of the active layers in the first device stack 1202, the gate dielectric 2510 surrounding the patterned portions 902a' of the SOI layer/patterned portions 908' of the active layers over the interfacial layer 2504, and the gate electrode 2512 disposed on the gate dielectric 2510 which surrounds the patterned portions 902a' of the SOI layer/patterned portions 908' of the active layers in the first device stack 1202 in a gate all around configuration. The gate electrode 2512 includes the at least one of workfunction-setting metal(s) 2514 disposed on the gate dielectric 2510, and the optional (low-resistance) fill metal 2516 disposed on the workfunction-setting metal(s) 2514.

Figures 26A, 26B:
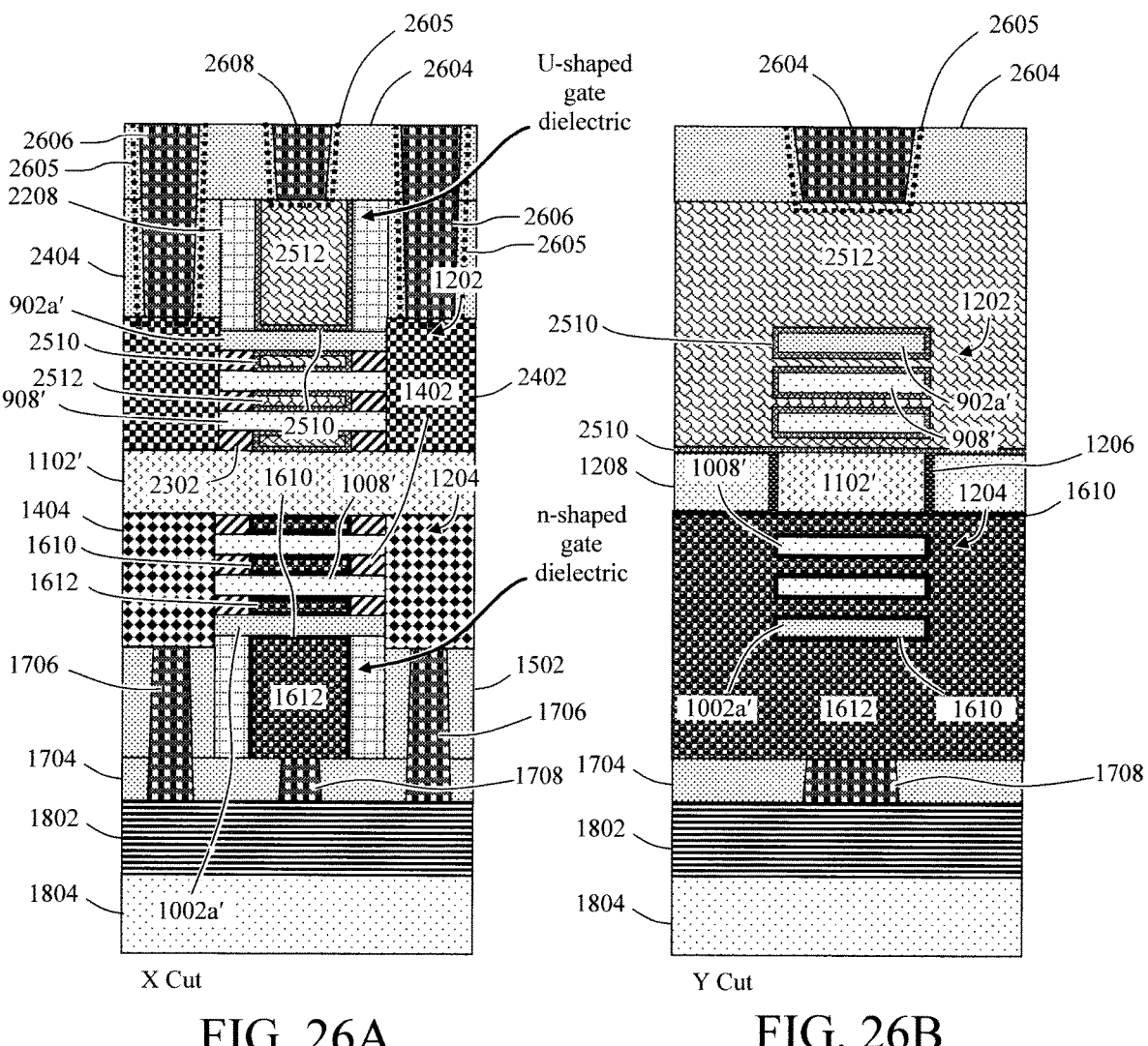
FIG. 26A is an X cross-sectional view and FIG. 26B is a Y cross-sectional view illustrating interconnects having been formed to the source/drain regions and the gate electrode in the first device stack according to an embodiment of the present invention.

As shown in FIG. 26A (an X cross-sectional view) and FIG. 26B (a Y cross-sectional view), interconnects 2606 and 2608 are formed which directly contact the source/drain regions 2402 and gate electrode 2512, respectively. As shown in FIGS. 26A-B, patterned portion 1102' of the bonding layer 1102 is present over inner spacers 1402, source/drain regions 1404, gate dielectric 1610 and gate electrode 1612 of the bottom transistor, and under the inner spacers 2302, source/drain regions 2402, gate dielectric 2510 and gate electrode 2512 of the top transistor.

In order to form the interconnects 2606 and 2608, an interlayer dielectric 2604 is first deposited onto the top transistor over the dielectric spacers 2208 and gate dielectric 2510/gate electrode 2512. Suitable interlayer dielectric 2604 materials include, but are not limited to, SiN, SiOC and/or oxide low-k materials such as SiOx and/or ULK-ILD materials such as pSiCOH, which can be deposited using a process such as CVD, ALD or PVD. Following deposition, the interlayer dielectric 2604 can be polished using a process such as chemical mechanical polishing.

Interconnects 2606 and 2608 are then formed in the interlayer dielectric 2604. To do so, standard lithography and etching techniques (see above) are employed to pattern features 2605 (e.g., trenches and/or vias) in the interlayer dielectric 2604. The features 2605 are then filled with a contact metal(s) to form the interconnects 2606 and 2608. As provided above, suitable contact metals include, but are not limited to, Cu, Ni, Pt, Ru, Co and/or W, which can be deposited using a process such as evaporation, sputtering, or electrochemical plating. Following deposition, the metal overburden can be removed using a process such as chemical-mechanical polishing.

Prior to depositing the contact metal(s) into the features 2605, a conformal barrier layer (not shown) can be deposited into and lining the features 2605. Use of such a barrier layer helps to prevent diffusion of the contact metal(s) into the surrounding interlayer dielectric 2604. As provided above, suitable barrier layer materials include, but are not limited to, Ru. Ta, TaN, Ti, and/or TiN. Additionally, a seed layer (not shown) can be deposited into and lining the features

2605 prior to deposition of the contact metal(s). A seed layer facilitates plating of the contact metal(s) into the features 2605.

As shown in FIGS. 26A-B, the top transistor includes the dielectric spacers 2208/inner spacers 2302 above/between the patterned portions 902a' of the SOI layer/patterned portions 908' of the active layers, the source/drain regions 2402 interconnected by the patterned portions 902a' of the SOI layer/patterned portions 908' of the active layers, the interlayer dielectric 2404 disposed on the source/drain regions 2402, the gate dielectric 2510 disposed on the patterned portions 902a' of the SOI layer/patterned portions 908' of the active layers and along the sidewalls of the dielectric spacers 2208 and inner spacers 2302, and the gate electrode 2512 disposed on the gate dielectric 2510 surrounding a portion of each of the patterned portions 902a' of the SOI layer/patterned portions 908' of the active layers in a gate all around configuration.

Further, it can be seen in FIGS. 26A-B that, as compared to the previous example, bonding the wafers earlier in the process and then, after forming the bottom transistor, flipping the stacked structure to form the top transistor results in gate dielectric shapes in the bottom and top transistors that are mirror images of one another. For instance, gate dielectric 1610 of the bottom transistor has what is referred to herein as an 'n-shape' below the patterned portions 1002a' of the SOI layer/patterned portions 1008' of the active layers. Namely, below the patterned portions 1002a' of the SOI layer/patterned portions 1008' of the active layers stack the gate dielectric 1610 is present along the top and opposite sidewalls of the gate electrode 1612 thereby forming the letter 'n'. By comparison, gate dielectric 2510 of the top transistor has a U-shape over the patterned portions 902a' of the SOI layer/patterned portions 908' of the active layers. Namely, over the patterned portions 1002a' of the SOI layer/patterned portions 1008' of the active layers stack the gate dielectric 2510 is present along the bottom and opposite sidewalls of the gate electrode 2512 thereby forming the letter 'U'. It is notable that, in addition to these shape differences, the interfacial layer 1604 and/or gate dielectric 1610 can have a different composition and/or thickness from the interfacial layer 2504 and/or gate dielectric 2510 as described in detail above. Further, the stacked FET design shown in FIGS. 26A-B has a unique orientation of components where the inner spacers 1402 and source/drain regions 1404 of the bottom transistor both directly contact the patterned portion 1102' of the bonding layer. The gate electrode 1612 of the bottom transistor is, however, separated from the patterned portion 1102' of the bonding layer by the gate dielectric 1610. Likewise, the inner spacers 2302 and source/drain regions 2402 of the top transistor both directly contact the patterned portion 1102' of the bonding layer. The gate electrode 2512 of the top transistor is, however, separated from the patterned portion 1102' of the bonding layer by the gate dielectric 2510.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A stacked field-effect transistor (FET) device, comprising:

a bottom transistor disposed on a wafer; and a top transistor bonded on top of the bottom transistor via a bonding layer, wherein the bottom transistor comprises a stack of first active layers, a first gate dielectric disposed on the stack of first active layers, and a first gate electrode disposed on the first gate dielectric and in direct contact with the bonding layer, wherein the top transistor comprises a stack of second active layers, a second gate dielectric disposed on the stack of second active layers, and a second gate electrode disposed on the second gate dielectric, wherein the second gate electrode is separated from the bonding layer by the second gate dielectric and wherein the first gate dielectric has at least one of a different composition and a different thickness from the second gate dielectric.

2. The stacked FET device of claim 1, wherein the first gate dielectric is present over the stack of first active layers along a bottom and opposite sidewalls of the first gate electrode.

3. The stacked FET device of claim 2, wherein the second gate dielectric is present over the stack of second active layers along a bottom and opposite sidewalls of the second gate electrode.

4. The stacked FET device of claim 1, wherein the first gate dielectric of the bottom transistor is present below the stack of first active layers along a top and opposite sidewalls of the first gate electrode.

5. The stacked FET device of claim 4, wherein the second gate dielectric of the top transistor is present over the stack of second active layers along a bottom and opposite sidewalls of the second gate electrode.

6. The stacked FET device of claim 1, wherein the bottom transistor further comprises first source/drain regions interconnected to the stack of first active layers, wherein the top transistor further comprises second source/drain regions interconnected to the stack of second active layers, and wherein the second source/drain regions of the top transistor directly contact the bonding layer.

7. A stacked field-effect transistor (FET) device, comprising:
a bottom transistor disposed on a wafer; and
a top transistor bonded on top of the bottom transistor via a bonding layer, wherein the bottom transistor comprises a stack of first active layers, a first interfacial layer disposed on the stack of first active layers directly upon the bonding layer, a first gate dielectric disposed on the first interfacial layer, and a first gate electrode disposed directly on the first gate dielectric and in direct contact with the bonding layer, wherein the top transistor comprises a stack of second active layers, a second interfacial layer disposed on the stack of second active layers, a second gate dielectric disposed on the second interfacial layer, and a second gate electrode disposed on the second gate dielectric and separated from the bonding layer by the second gate dielectric, and wherein the first gate dielectric has at least one of a different composition and a different thickness from the second gate dielectric.

8. The stacked FET device of claim 7, wherein the first interfacial layer has at least one of a different composition and a different thickness from the second interfacial layer.

9. The stacked FET device of claim 7, wherein the first gate dielectric is present over the stack of first active layers along a bottom and opposite sidewalls of the first gate electrode.

10. The stacked FET device of claim 9, wherein the second gate dielectric is present over the stack of second active layers along a bottom and opposite sidewalls of the second gate electrode.

11. The stacked FET device of claim 7, wherein the first gate dielectric is present below the stack of first active layers along a top and opposite sidewalls of the first gate electrode.

12. The stacked FET device of claim 11, wherein the second gate dielectric is present over the stack of second active layers along a bottom and opposite sidewalls of the second gate electrode.

13. A method, comprising:
forming a stacked field-effect transistor (FET) device on a wafer, the stacked FET device comprising a bottom transistor disposed on the wafer, and a top transistor bonded on top of the bottom transistor via a bonding layer, wherein the bottom transistor comprises a stack of first active layers, a first gate dielectric disposed on the stack of first active layers, and a first gate electrode disposed on the first gate dielectric and in direct contact with the bonding layer, wherein the top transistor comprises a stack of second active layers, a second gate dielectric disposed on the stack of second active layers, and a second gate electrode disposed on the second gate dielectric, wherein the second gate electrode is separated from the bonding layer by the second gate dielectric and wherein the first gate dielectric has at least one of a different composition and a different thickness from the second gate dielectric.

14. The method of claim 13, further comprising:
forming the bottom transistor comprising the first gate dielectric;
forming the top transistor comprising the second gate dielectric; and
bonding top transistor to a top of the bottom transistor via the bonding layer.

15. The method of claim 13, further comprising:
bonding the stack of first active layers to the stack of second active layers via the bonding layer to form a stacked structure;
forming the bottom transistor comprising the first gate dielectric in the stack of second active layers;
flipping the stacked structure; and
forming the top transistor comprising the second gate dielectric in the stack of first active layers.

16. The stacked FET device of claim 1, wherein the first gate dielectric has a different dopant composition relative to the second gate dielectric.

17. The stacked FET device of claim 1, wherein the first gate dielectric has a different oxidization composition relative to the second gate dielectric.

18. The stacked FET device of claim 1, wherein the first gate dielectric has a different nitridation composition relative to the second gate dielectric.

19. The stacked FET device of claim 1, wherein the first gate dielectric has a nitridated composition and the second gate dielectric has a nitrogen-free composition, or vice versa.

20. The stacked FET device of claim 1, wherein the first gate dielectric has a nitridated composition and the second gate dielectric has an oxidized composition, or vice versa.

* * * * *